(12) United States Patent
Park et al.

(10) Patent No.: US 12,199,056 B2
(45) Date of Patent: Jan. 14, 2025

(54) SEMICONDUCTOR DEVICE, SEMICONDUCTOR PACKAGE AND METHOD OF MANUFACTURING THE SAME

(71) Applicant: Samsung Electronics Co., Ltd., Suwon-si (KR)

(72) Inventors: Jumyong Park, Cheonan-si (KR); Unbyoung Kang, Hwaseong-si (KR); Byeongchan Kim, Asan-si (KR); Solji Song, Suwon-si (KR); Chungsun Lee, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 398 days.

(21) Appl. No.: 17/726,363

(22) Filed: Apr. 21, 2022

(65) Prior Publication Data

US 2023/0070532 A1    Mar. 9, 2023

(30) Foreign Application Priority Data

Sep. 3, 2021    (KR) .......................... 10-2021-0117673

(51) Int. Cl.
*H01L 23/48* (2006.01)
*H01L 23/00* (2006.01)
*H01L 25/065* (2023.01)

(52) U.S. Cl.
CPC ............ *H01L 24/05* (2013.01); *H01L 23/481* (2013.01); *H01L 24/03* (2013.01); *H01L 24/08* (2013.01); *H01L 24/09* (2013.01); *H01L 24/80* (2013.01); *H01L 25/0657* (2013.01); *H01L 24/16* (2013.01); *H01L 24/24* (2013.01);

(Continued)

(58) Field of Classification Search
CPC ....... H01L 24/05; H01L 24/08; H01L 23/481; H01L 25/0657

See application file for complete search history.

(56) References Cited

U.S. PATENT DOCUMENTS 5,880,003 A    3/1999    Hayashi
6,294,471 B1   9/2001    Tseng
(Continued)

FOREIGN PATENT DOCUMENTS

JP    H07-094453 A    4/1995

*Primary Examiner* — Dale E Page
*Assistant Examiner* — Wilner Jean Baptiste
(74) *Attorney, Agent, or Firm* — Harness, Dickey & Pierce, P.L.C.

(57) ABSTRACT

A semiconductor package includes a first semiconductor chip having a first substrate, a first insulating layer on the first substrate, and a plurality of first bonding pads on the first insulating layer, and having a flat upper surface by an upper surface of the first insulating layer and upper surfaces of the plurality of first bonding pads; and a second semiconductor chip on the upper surface of the first semiconductor chip and having a second substrate, a second insulating layer below the second substrate and in contact with the first insulating layer, and a plurality of second bonding pads on the second insulating layer and in contact with the first bonding pads, respectively, wherein the first insulating layer includes an insulating interfacial layer in contact with the second insulating layer, embedded in the first insulating layer, and spaced apart from the plurality of first bonding pads.

20 Claims, 23 Drawing Sheets

(52) U.S. Cl.
CPC .............. *H01L 2224/0362* (2013.01); *H01L 2224/0391* (2013.01); *H01L 2224/05082* (2013.01); *H01L 2224/05147* (2013.01); *H01L 2224/05166* (2013.01); *H01L 2224/05184* (2013.01); *H01L 2224/05187* (2013.01); *H01L 2224/05541* (2013.01); *H01L 2224/05578* (2013.01); *H01L 2224/05644* (2013.01); *H01L 2224/05647* (2013.01); *H01L 2224/05687* (2013.01); *H01L 2224/0801* (2013.01); *H01L 2224/08059* (2013.01); *H01L 2224/08147* (2013.01); *H01L 2224/0903* (2013.01); *H01L 2224/16227* (2013.01); *H01L 2224/16237* (2013.01); *H01L 2224/24146* (2013.01); *H01L 2224/80895* (2013.01); *H01L 2224/80896* (2013.01); *H01L 2225/06517* (2013.01); *H01L 2225/06524* (2013.01); *H01L 2225/06544* (2013.01); *H01L 2225/06589* (2013.01); *H01L 2924/1431* (2013.01); *H01L 2924/1434* (2013.01)

(56) References Cited

U.S. PATENT DOCUMENTS

| | | | |
|---|---|---|---|
| 6,384,482 B1 | 5/2002 | Yang et al. | |
| 6,548,399 B1 | 4/2003 | Andideh et al. | |
| 7,030,019 B2 | 4/2006 | Kawasaki | |
| 2004/0201088 A1* | 10/2004 | Kim | H01L 25/50 |
| | | | 257/E21.705 |
| 2013/0320556 A1 | 12/2013 | Liu et al. | |

* cited by examiner

SEMICONDUCTOR DEVICE, SEMICONDUCTOR PACKAGE AND METHOD OF MANUFACTURING THE SAME

CROSS-REFERENCE TO RELATED APPLICATION(S)

This application claims benefit of priority to Korea patent Application No. 10-2021-0117673 filed on Sep. 3, 2021 in the Korean Intellectual Property Office, the disclosure of which is incorporated herein by reference in its entirety.

BACKGROUND

Example embodiments of the present disclosure relate to a semiconductor device, a semiconductor package and a method of manufacturing the same.

There have been efforts to improve integration density of various semiconductor packages such as logic circuits and memories. As a method for integrating more components (e.g., semiconductor chips) into a package structure, a stacking technique such as a three dimensional integrated circuit (3D IC) has been widely used.

Recently, the 3D IC technique may, by reducing a length of interconnection between stacked chips using a direct bonding, have high integration density, a high processing speed, and a wide bandwidth. Generally, a bonding pad for interconnection has been manufactured using a damascene process, but it may be difficult to implement high flatness required for direct bonding.

SUMMARY

Example embodiments of the present disclosure is to provide a semiconductor package having improved reliability.

Example embodiments of the present disclosure is to provide a semiconductor chip having improved reliability.

Example embodiments of the present disclosure is to provide a method of manufacturing a semiconductor chip having improved reliability.

According to example embodiments of the present disclosure, a semiconductor package includes a first semiconductor chip having a first substrate, a first insulating layer on the first substrate, and a plurality of first bonding pads on the first insulating layer, and having a flat upper surface by an upper surface of the first insulating layer and upper surfaces of the plurality of first bonding pads; and a second semiconductor chip on the upper surface of the first semiconductor chip and having a second substrate, a second insulating layer below the second substrate and in contact with the first insulating layer, and a plurality of second bonding pads on the second insulating layer and in contact with the first bonding pads, respectively, wherein the first insulating layer includes an insulating interfacial layer in contact with the second insulating layer, embedded in the first insulating layer, and spaced apart from the plurality of first bonding pads.

According to example embodiments of the present disclosure, a semiconductor package includes a first semiconductor chip having a first substrate, a first insulating layer on the first substrate, and a plurality of first bonding pads on the first insulating layer, and having a flat upper surface by an upper surface of the first insulating layer and upper surfaces of the plurality of first bonding pads; and a second semiconductor chip on the upper surface of the first semiconductor chip and having a second substrate, a second insulating layer below the second substrate and in contact with the first insulating layer, and a plurality of second bonding pads on the second insulating layer and in contact with the first bonding pads, respectively, wherein the first semiconductor chip includes a protective insulating film between the first substrate and the first insulating layer, through electrodes penetrating the first substrate and the first insulating layer and connected to the plurality of first bonding pads, respectively, and a first conductive barrier layer and a first seed layer on the protective insulating film and between the plurality of first bonding pads and the through electrodes, and wherein the first conductive barrier layer and the first seed layer are inwardly spaced apart from an outer periphery of each of the plurality of first bonding pads.

According to example embodiments of the present disclosure, a semiconductor chip includes a substrate having a first surface having an active region and a second surface opposite to the first surface; an interlayer insulating film on the first surface of the substrate and having a wiring structure connected to the active region; a first passivation layer on the interlayer insulating film and having first bonding pads electrically connected to the wiring structure; a protective insulating film on the second surface of the substrate; through electrodes electrically connected to the wiring structure and penetrating the substrate and the protective insulating film; a second passivation layer on the protective insulating film and having second bonding pads electrically connected to the through electrode, where each of the second bonding pads has a width increasing toward the second surface of the substrate; and a conductive layer on the protective insulating film and between the second bonding pads and the through electrodes, and inwardly spaced apart from an outer periphery of each of the second bonding pads.

According to example embodiments of the present disclosure, a method of manufacturing a semiconductor chip includes preparing a semiconductor wafer for a plurality of semiconductor chips; forming a photoresist pattern having a plurality of openings on the semiconductor wafer, where each of the plurality of openings defines a bonding pad formation region; forming a plurality of bonding pads in the plurality of openings, respectively; removing the photoresist pattern; forming a first insulating layer on the semiconductor wafer to cover the plurality of bonding pads; forming a polishing stop film and a second insulating film on the first insulating film, where the first and second insulating films and the polishing stop film are included in a multilayer passivation; and polishing the multilayer passivation using the polishing stop film to expose upper surfaces of the plurality of bonding pads.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments of the present disclosure will be described as follows with reference to the accompanying drawings.

Figure 1:
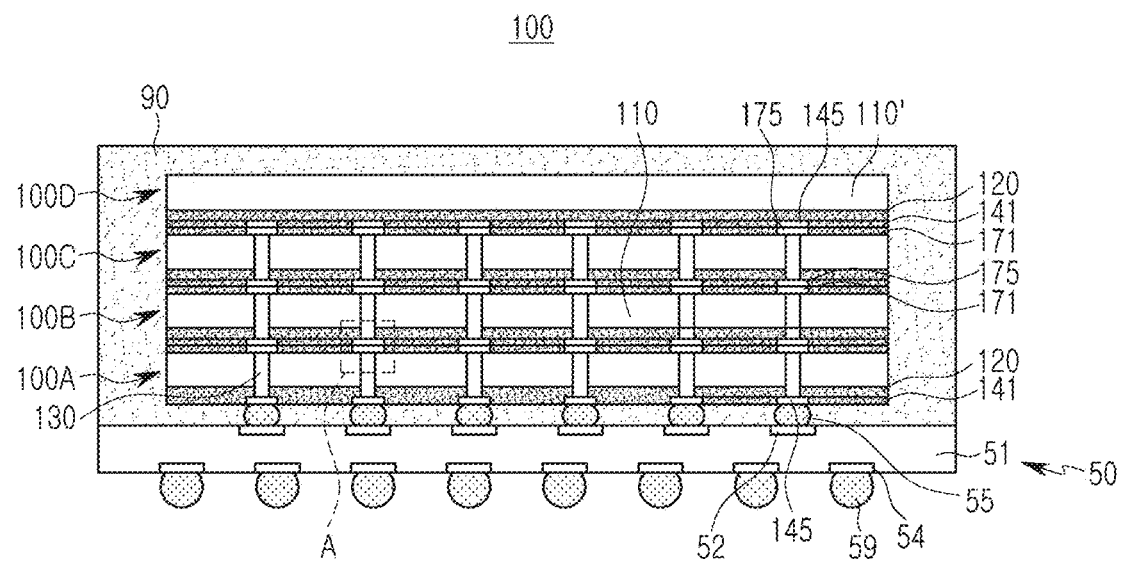
FIG. 1 is a cross-sectional diagram illustrating a semiconductor package according to example embodiments of the present disclosure, viewed from the side.
Figure 2:
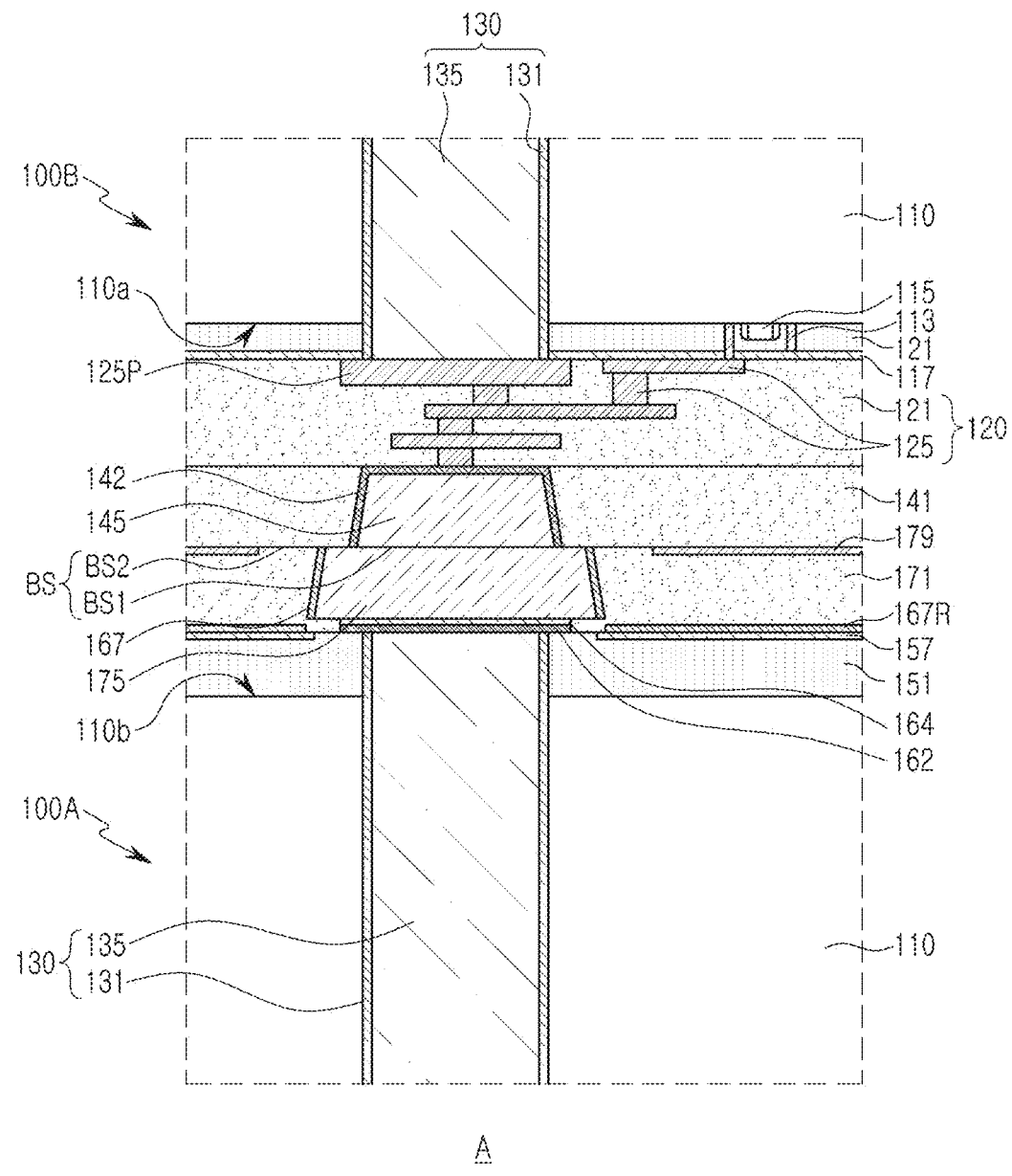
FIG. 2 is an enlarged diagram illustrating portion "A" of the semiconductor package illustrated in FIG. 1.

FIG. 1 is a cross-sectional diagram illustrating a semiconductor package according to example embodiments. FIG. 2 is an enlarged diagram illustrating portion "A" of the semiconductor package illustrated in FIG. 1.

Referring to FIGS. 1 and 2, a semiconductor package 100 may include first to fourth semiconductor chips 100A, 100B, 100C, and 100D stacked on a package substrate 50, and/or a molding member 90 surrounding the first to fourth semiconductor chips 100A, 100B, 100C, and 100D.

The package substrate 50 may include an upper pad 52 and a lower pad 54 disposed on upper and lower surfaces of a substrate body 51, respectively. The substrate body 51 may include an internal wiring (not illustrated) connecting the upper pad 52 to the lower pad 54. For example, the package substrate 50 may include a printed circuit board (PCB) or a silicon interposer substrate (an Si interposer substrate). Also, the semiconductor package 100 may further include conductive bumps 55 connected to the first semiconductor chip 100A and external connection terminals 59 for connection to an external device (e.g., a motherboard).

In example embodiments, the first semiconductor chip 100A may have substantially the same structure as or similar to those of the second to fourth semiconductor chips 100B, 100C, and 100D, and the same or similar components may be denoted by the same or similar reference numerals, and descriptions of the same components need not be repeated. However, differently from the other semiconductor chips, the fourth semiconductor chip 100D disposed in an uppermost portion may not include a through electrode and may have a relatively large thickness.

For example, each of the first to third semiconductor chips 100A, 100B, and 100C may include a substrate 110, a wiring structure 120, a through electrode 130, a lower bonding pad 145, and/or an upper bonding pad 175. The fourth semiconductor chip 100D disposed on the uppermost portion may include the same components other than the through electrode 130.

The substrate 110 may have a first surface 110a having an active region and a second surface 110b disposed opposite to the first surface. The first surface 110a and the second surface 110b may also be referred to as an active surface and an inactive surface, respectively. A plurality of individual devices 115 such as transistors may be formed on the first surface 110a (the active region) of the substrate 110. An interlayer insulating film 111 covering the plurality of individual devices 115 may be formed on the first surface 110a of the substrate 110, and the plurality of individual devices 115 may be connected to each other by an interconnection portion 113 (e.g., a contact plug). A wiring structure 120 having a low dielectric layer 121 and a plurality of wiring layers 125 may be disposed on the interlayer insulating film 111, and the wiring layer 125 may be connected to the plurality of individual devices 115 by the interconnection portion 113. The wiring layer 125 may include a multilayer structure including a wiring pattern and a via. Also, the wiring structure 120 may be connected to the through electrode 130. For example, as illustrated in FIG. 2, the wiring layer 125 may include a landing pad 125P connected to the through electrode 130.

The interlayer insulating film 111 or the low dielectric layer 121 may be flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PE-TEOS), fluoride silicate glass (FSG), high density plasma (HDP) oxide, plasma enhanced oxide (PEOX), flowable CVD (FCVD) oxide, or a combination thereof. The interlayer insulating film 111 or the low dielectric layer 121 may be formed using a chemical vapor deposition (CVD), a flowable-CVD process, or a spin coating process.

Referring to FIG. 2, an insulating protective layer 157 disposed on the second surface 110b of the substrate 110 may be included, and the through electrode 130 may be configured to penetrate the substrate 110, the interlayer insulating film 111, and the insulating protective layer 157. The through electrode 130 may include a via plug 135 and a side insulating layer 131 surrounding a side surface of the via plug 135. The side insulating layer 131 may electrically isolate the via plug 135 from the substrate 110.

A lower insulating layer 141 disposed on the lower surface of each of the first to fourth semiconductor chips 100A, 100B, 100C, and 100D, that is, disposed on the wiring structure 120, and a lower bonding pad 145 disposed on the lower insulating layer 141 and connected to the wiring layer 125 may be included. Also, an upper insulating layer 171 disposed on the upper surface of each of the first to third semiconductor chips 100A, 100B, and 100C, that is, on the insulating protective layer 157, and an upper bonding pad 175 disposed on the upper insulating layer 171 and connected to the through electrode 130 may be included. In each of the first to third semiconductor chips 100A, 100B, and 100C, the upper and lower bonding pads 145 and 175 may be vertically connected to each other together with the wiring layer 125 by the through electrode 130.

In example embodiments, the first to fourth semiconductor chips 100A, 100B, 100C, and 100D may be stacked by hybrid bonding. As illustrated in FIG. 2, as for the bonding of the first and second semiconductor chips 100A and 100B, an intermetallic interfacial bonding surface BS1 by the lower connecting pad 145 and the upper connecting pad 175 may be combined with an inter-dielectric interfacial bonding surface BS2 between the lower insulating layer 141 and the upper insulating layer 171 such that a hybrid interfacial bonding surface BS may be formed. Similarly, bonding of the second and third semiconductor chips 100B and 100C and the third and fourth semiconductor chips 100C and 100D may be implemented.

For example, as illustrated in FIG. 2, the upper bonding pad 175 of the first semiconductor chip 100A may be directly bonded to the lower bonding pad 145 of the second semiconductor chip 100B such that an electrical connection between the first and second semiconductor chips 100A and 100B and bonding between the first and second semiconductor chips 100A and 100B may be implemented.

The lower bonding pad 145 and the upper bonding pad 175 may include the same metal, such as, for example, copper (Cu). The lower bonding pad 145 and the upper bonding pad 175, directly bonded to each other, may be bonded by copper interdiffusion through a high-temperature annealing process. The metal forming the lower bonding pad 145 and the upper bonding pad 175 is not limited to copper, and may include other metal materials (e.g., Au) which may implement the bonding as above. Electrical connection may be implemented by the strong bonding between the stacked semiconductor chips through the metal bonding and also the direct-bonding without a connection bump. A path for transmitting and receiving at least one of a control signal, a power signal, a ground signal, and a data signal between the first to fourth semiconductor chips 100A, 100B, 100C, and 100D may be provided. Since a connection bump such as solder is not used, transmission loss may be reduced.

Also, the upper insulating layer 171 disposed on the upper surface of each of the first to third semiconductor chips 100A, 100B, and 100C may be directly bonded to the lower insulating layers 141 disposed on the lower surface of each of the second to fourth semiconductor chips 100B, 100C, and 100D. The upper insulating layer 171 and the lower insulating layer 141 may include the same material or similar materials. The upper insulating layer 171 in example embodiments may include an insulating interfacial layer 179 in contact with the lower insulating layer 141 and embedded in the upper insulating layer 171. The insulating interfacial layer 179 may include a material different from that of the upper insulating layer 171.

Figure 3:
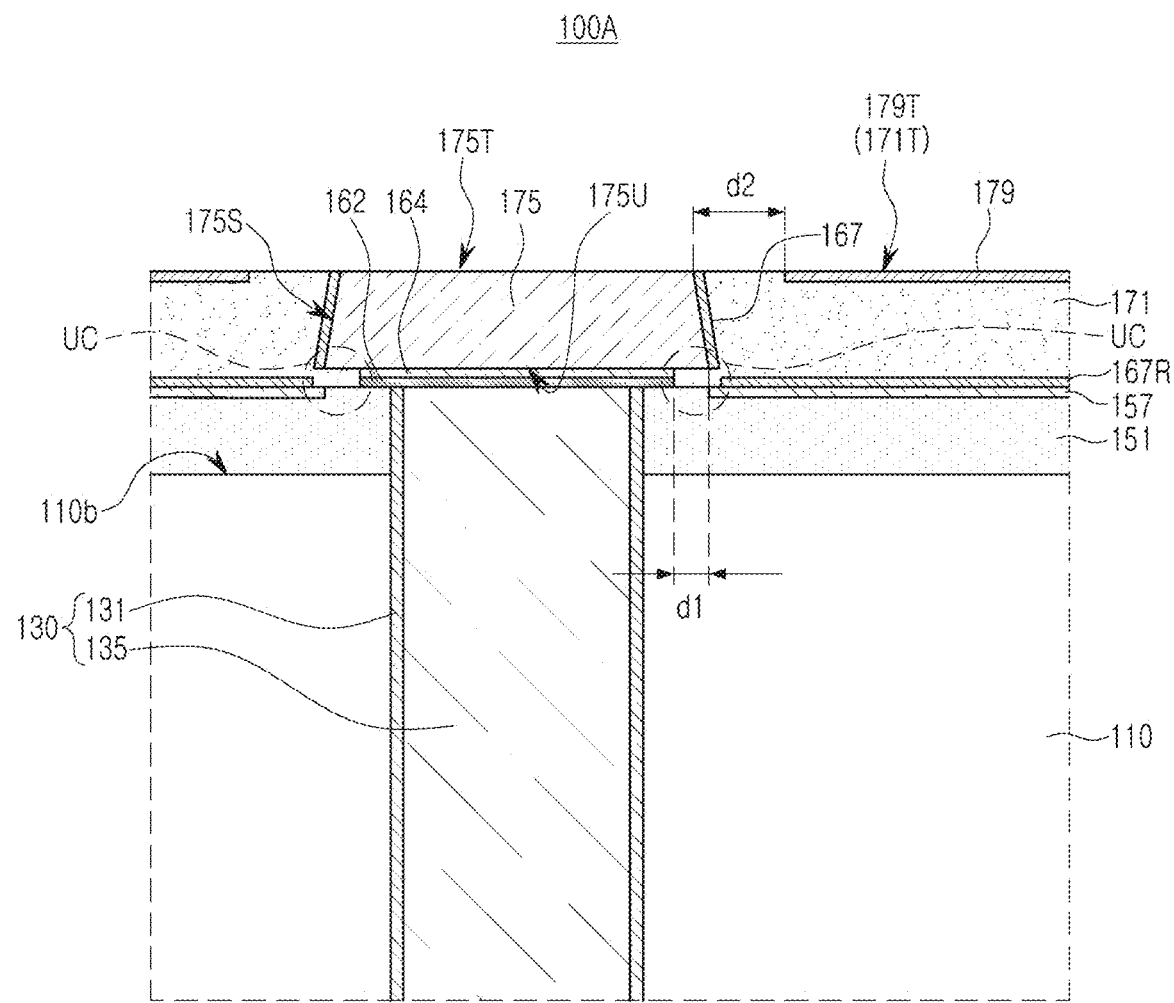
FIG. 3 is an enlarged diagram illustrating a portion of a semiconductor chip employed in the semiconductor package illustrated in FIG. 2.

As illustrated in FIG. 3, the insulating interfacial layer 179 in example embodiments may be a component of the first semiconductor chip 100A, and may be formed on the upper insulating layer 171 of the first semiconductor chip 100A and may be provided as a bonding surface with the lower insulating layer 141 of the second semiconductor chip 100B.

The insulating interfacial layer 179 may be spaced apart from the upper bonding pad 175 on the upper surface of the upper insulating layer 171. This separation may be caused by a multilayer passivation employed for a planarization process (see FIGS. 8E and 8F). The insulating interfacial layer 179 may be a remaining portion of the polishing stop film of the multilayer passivation. In example embodiments, a distance d2 by which the insulating interfacial layer 179 is spaced apart from the upper bonding pad 175 may be in the range of 60% to 100% of the thickness of the upper bonding pad 175.

For example, the upper insulating layer 171 and the lower insulating layer 141 may include silicon oxide. The insulating interfacial layer 179 may include at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO) and aluminum oxide carbide (AlOC). In example embodiments, the upper insulating layer 171 and the insulating interfacial layer 179 may include the same material having different polishing properties. For example, the upper insulating layer 171 may be porous silicon oxide, and the insulating interfacial layer 179 may be silicon oxide deposited by another process such as CVD.

The direct bonding between the upper insulating layer 171 (in particular, the insulating interfacial layer 179) and the lower insulating layer 141 may be performed by applying a high-temperature annealing process while the two insulating layers 141 and 171 are in direct contact with each other. The bonding may ensure stronger bonding strength by covalent bonding.

The upper bonding pad 175 in example embodiments may be formed by a process different from the process of forming the lower bonding pad 145. For example, the lower bonding pad 145 may be formed by a general damascene process, whereas the upper bonding pad 175 may be formed by a new method disclosed herein, that is, a photoresist process and a planarization process using a polishing stop film (or the insulating interfacial layer 179). The upper bonding pad 175 formed by the new process may have structural properties different from that of the lower bonding pad 145.

As illustrated in FIG. 2, the lower bonding pad 145 may have a width increasing toward the interfacial bonding surface BS, whereas the upper bonding pad 175 in example embodiments may have a width decreasing toward the interfacial bonding surface BS. As for the lower bonding pad 145, the lower insulating layer 141 may be formed in advance, and an opening for the pad may be formed, and thereafter, the conductive barrier layer 142 may be formed in the opening, and the lower bonding pad 145 may be formed using a plating process. The conductive barrier layer 142 may include at least one of titanium (Ti), titanium nitride (TiN), tantalum (Ta), and tantalum nitride (TaN).

Differently from the above example, the upper bonding pad 175 may have a side surface 175S inclined toward the interfacial bonding surface BS, and a capping barrier film 167 may be formed on the side surface 175S of the upper bonding pad 175. The capping barrier film 167 in example embodiments may be an insulating material. The capping barrier film 167 may include a material the same as or similar to that of the insulating interfacial layer 179. For example, the capping barrier film 167 may include at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO) and aluminum oxide carbide (AlOC). In example embodiments, the thickness of the capping barrier film 167 may be in a range of 100-300 nm.

As illustrated in FIGS. 2 and 3, an extended barrier film 167R formed of the same material as that of the capping barrier film 167 may be formed on the protective insulating film 151. A buffer film 157 such as a polishing stop film or a barrier may be disposed on the upper surface of the protective insulating film 151. For example, the buffer film 157 may include silicon nitride, silicon carbide, silicon oxynitride, or silicon carbonitride.

In some example embodiments, the capping barrier film 167 and the extension barrier film 167R disposed on the side surface 175S of the upper bonding pad 175 may be separated from each other, but in other example embodiments, the capping barrier film 167 may be continuously formed to be connected to the extended barrier film 167R.

A conductive barrier layer 162 and a seed layer 164 may be disposed on the lower surface 175U of the upper bonding pad 175. For example, as illustrated in FIGS. 2 and 3, the conductive barrier layer 162 and the seed layer 164 may be sequentially disposed on the protective insulating film 151 to be positioned in a region between the upper bonding pad 175 and the through electrode 130. In particular, the conductive barrier layer 162 and the seed layer 164 may have an undercut structure UC, inwardly spaced apart from the outer periphery of the upper bonding pad 175. A distance d1 by which the conductive barrier layer 162 and the seed layer 164 are spaced apart from the outer periphery of the upper bonding pad 175 may be in the range of 1% to 15% of the width (with respect to the width of a lower end) of the upper bonding pad 175, and in example embodiments, in the range of 2% to 10% of the width. For example, the conductive barrier layer 162 may include at least one of titanium (Ti), titanium nitride (TiN), tantalum (Ta), and tantalum nitride (TaN). For example, the seed layer 164 may include copper (Cu), chromium-copper (Cr—Cu), palladium (Pd), platinum (Pt), gold (Au), or a combination thereof. In example embodiments, the seed layer 164 may include Cu. For example, the lower and upper bonding pads 145 and 175 may include copper (Cu), chromium-copper (Cr—Cu), palladium (Pd), platinum (Pt), or gold (Au), and in example embodiments, the lower and upper bonding pads 145 and 175 may include Cu. For example, the thickness of the first conductive barrier layer 162 may be in the range of 100-250 nm, and the thickness of the first seed layer 164 may be in the range of 50-150 nm.

As illustrated in FIG. 2, the upper bonding pad 175 may have an upper surface 175T substantially coplanar with the upper surface 171T of the upper insulating layer 171. In particular, in example embodiments, the upper surface 175T of the upper bonding pad 175 may be substantially coplanar with the upper surface of the insulating interfacial layer 179 embedded in the upper insulating layer 171.

As such, the hybrid bonding in example embodiments may be implemented by the metal bonding structure for directly bonding the upper bonding pad 175 to the lower bonding pad 145, and the dielectric bonding structure for directly bonding the upper insulating layer 171 (in particular, the insulating interfacial layer 179) to the lower insulating layer 141. Also, the bonding between the second and third semiconductor chips 100B and 100C and the bonding between the third and fourth semiconductor chips 100C and 100D may also be implemented by the hybrid bonding described with reference to FIG. 2.

The first to fourth semiconductor chips 100A, 100B, 100C, and 100D may be a memory chip or a logic chip. In example embodiments, the first to fourth semiconductor chips 100A, 100B, 100C, and 100D may be the same type of memory chip, and in another example, a portion of the first to fourth semiconductor chips 100A, 100B, 100C, and 100D may be memory chips, and the other portion may be logic chips.

For example, the memory chip may be a volatile memory chip such as a dynamic random access memory (DRAM) or a static random access memory (SRAM), or may be a non-volatile memory chip such as a phase-change random access memory (PRAM), a magnetic random access memory (MRAM), a ferroelectric random access memory (FeRAM), or a resistive random access memory (RRAM). In example embodiments, the first to fourth semiconductor chips 100A, 100B, 100C, and 100D may be high bandwidth memory (HBM) DRAMs.

In example embodiments, the first to fourth semiconductor chips 100A, 100B, 100C, and 100D may be stacked on the package substrate 500. The semiconductor package according to example embodiments may include the four same semiconductor chips 100A, 100B, 100C, and 100D as a multi-chip package, but example embodiments thereof are not limited thereto, and the semiconductor package may include a different number of semiconductor chips, and different types of semiconductor chips may be stacked (see FIGS. 11 and 12).

Figure 4:
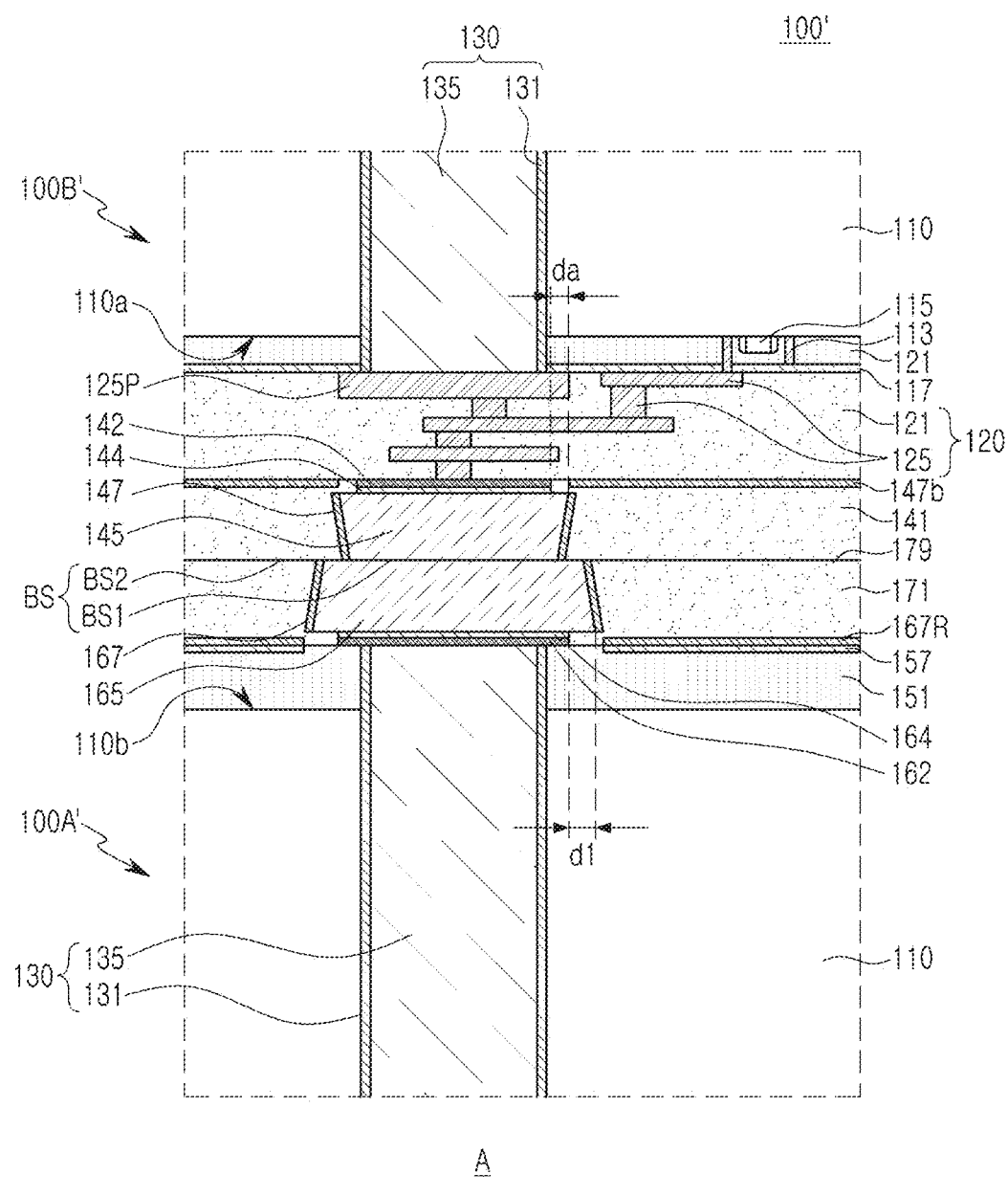
FIG. 4 is an enlarged diagram illustrating a portion (an interfacial bonding surface between semiconductor chips) of a semiconductor package according to example embodiments of the present disclosure.
Figure 5:
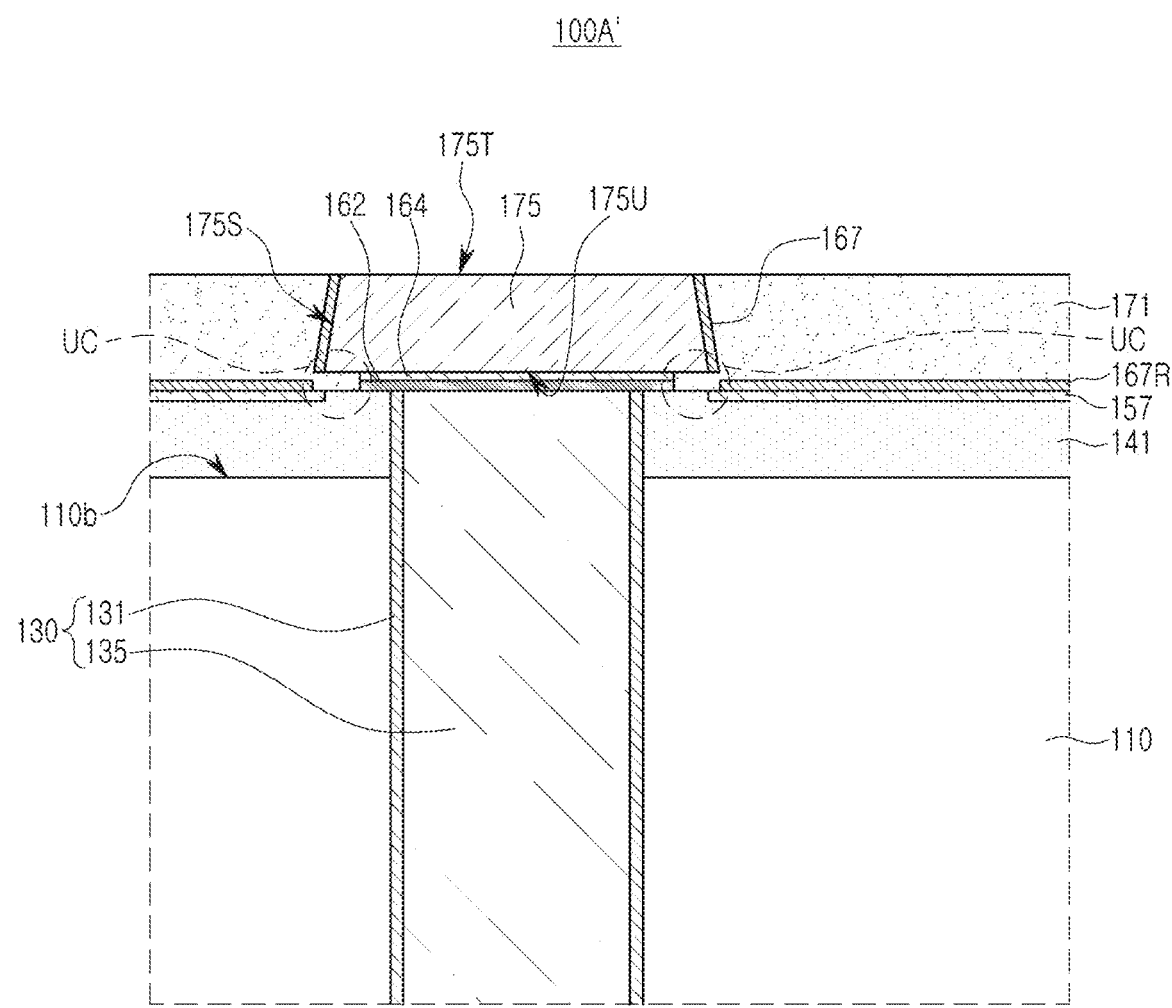
FIG. 5 is an enlarged diagram illustrating a portion of a semiconductor chip employed in a semiconductor package according to example embodiments of the present disclosure.

FIG. 4 is an enlarged diagram illustrating a portion (an interfacial bonding surface between semiconductor chips) of a semiconductor package according to example embodiments. FIG. 5 is an enlarged diagram illustrating a semiconductor chip employed in the semiconductor package, a portion of a semiconductor package, according to example embodiments.

FIG. 4 illustrates a portion corresponding to portion A in FIG. 1 similarly to FIG. 2, and FIG. 5 may be an enlarged diagram illustrating a single semiconductor chip (before bonding) similarly to FIG. 3.

Referring to FIGS. 4 and 5, a semiconductor package 100' according to example embodiments may have a structure similar to that of the semiconductor package 100 illustrated in FIGS. 1 to 3 other than the configuration in which the structure of the lower bonding pad 145 of the second semiconductor chip 100B' may be different, and the insulating interfacial layer 179 (in FIG. 2) is not provided. The descriptions of the same or similar components of the semiconductor package 100 illustrated in FIGS. 1 to 3 will be applied to the components in example embodiments unless otherwise indicated.

The lower bonding pad 145 in example embodiments may be formed by a process similar to the process of forming the upper bonding pad 175. As illustrated in FIG. 4, the lower bonding pad 145 may have a width decreasing toward the interfacial bonding surface. That is, the lower bonding pad 145 may have a side surface inclined toward the interfacial bonding surface, and a capping barrier film 147 may be formed on the side surface of the lower bonding pad 145. As for the capping barrier film 147, an extended barrier film 147R formed of the same material as that of the capping barrier film 147 may be formed on the wiring structure 120.

A conductive barrier layer 142 and a seed layer 144 may be disposed on a lower surface of the lower bonding pad 145. The conductive barrier layer 142 and the seed layer 144 may be disposed in order on the wiring structure 120 below the lower bonding pad 145. Also, the conductive barrier layer 142 and the seed layer 144 may have an undercut structure, inwardly spaced apart from the outer periphery of the lower bonding pad 145. A distance da by which the conductive barrier layer 142 and the seed layer 145 are spaced apart from the outer periphery of the lower bonding pad 145 may be in the range of 1% to 15% of the width (with respect to the width of the upper end) of the lower bonding pad 145, and may be in the range of 2% to 10% of the width in example embodiments. The lower bonding pad 145 may have an upper surface substantially coplanar with the upper surface of the lower insulating layer 141.

As illustrated in FIG. 4, an insulating interfacial layer may not be provided on the interfacial bonding surface between the upper insulating layer 175 and the lower insulating layer 145 in example embodiments. As illustrated in FIG. 5, the bonding surface of the first semiconductor chip 100A' may be provided by the upper bonding pad 175 and the upper insulating layer 171. That is, differently from example embodiments illustrated in FIG. 3, the bonding surface may be provided by the surface of the upper insulating layer 171 without an insulating interfacial layer.

Figure 6:
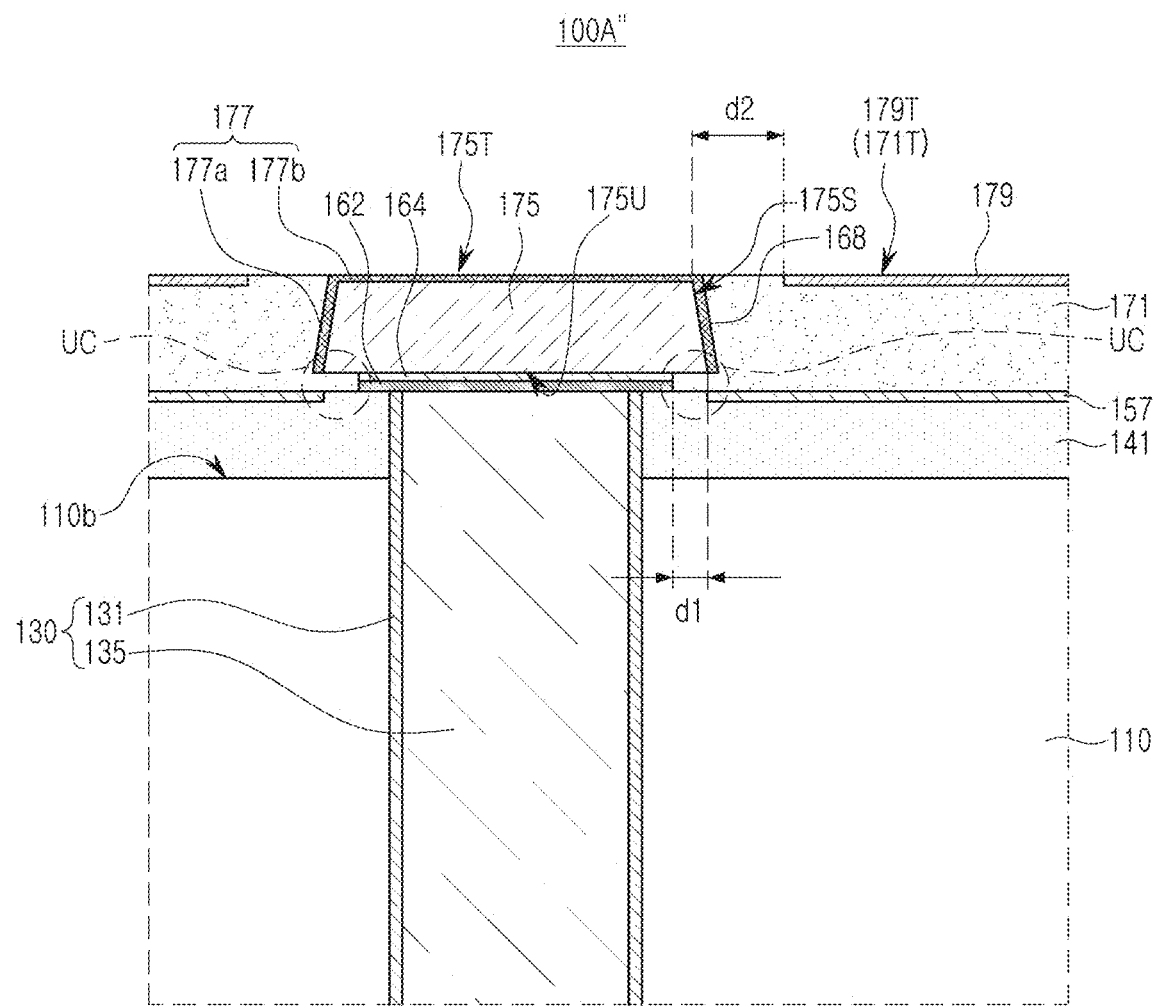
FIG. 6 is a cross-sectional diagram illustrating a semiconductor chip according to example embodiments of the present disclosure.

FIG. 6 is a cross-sectional diagram illustrating a semiconductor chip according to example embodiments. FIG. 6 is an enlarged diagram illustrating a single semiconductor chip (before bonding) similarly to FIGS. 3 and 5.

Referring to FIG. 6, a semiconductor chip 100A" according to example embodiments may have a structure similar to that of the semiconductor chip 100A illustrated in FIG. 3 other than the configuration in which the capping barrier film 168 may be a conductive material and the formation position thereof may be different. The descriptions of the same or similar components of the semiconductor package 100A illustrated in FIG. 3 will be applied to the components in example embodiments unless otherwise indicated.

The capping barrier film 168 in example embodiments may include a conductive material. For example, the capping barrier film 168 may include at least one of copper silicide ($CuSi_x$), titanium silicide ($TiSi_x$), CuSiN, cobalt (Co), tungsten (W), palladium (Pd), gold (Au), and nickel (Ni).

The capping barrier film 168 may be formed on the side surface of the upper bonding pad 175 and also on the upper surface. Since the capping barrier film 168 is formed of a conductive material, the capping barrier film 168 also may remain on the upper surface of the upper bonding pad 175, which may be the surface bonded to the lower bonding pad 145. In example embodiments, the capping barrier film 168 may be formed on almost the entire upper surface of the upper bonding pad 175, and a portion disposed on the upper surface may have a thickness less than a thickness of a portion disposed on the side surface. In other example embodiments, the capping barrier film 168 may remain in a partial region of the upper surface of the upper bonding pad 175. Also, the capping barrier film 168 may be formed only on the surface of the upper bonding pad 175 using a selective film formation process (e.g., electrolytic plating). Accordingly, in the first semiconductor chip 100A" according to example embodiments, differently from the aforementioned example embodiments, the extended barrier film portion 167R (in FIG. 3) disposed on the protective insulating film 151 may not be provided.

FIGS. 7A to 7D are cross-sectional diagrams illustrating main processes of a method of manufacturing a semiconductor chip according to example embodiments. The manufacturing method according to example embodiments may be the method of manufacturing the first semiconductor chip 100A described with reference to FIGS. 1 to 3.

Figure 7A:
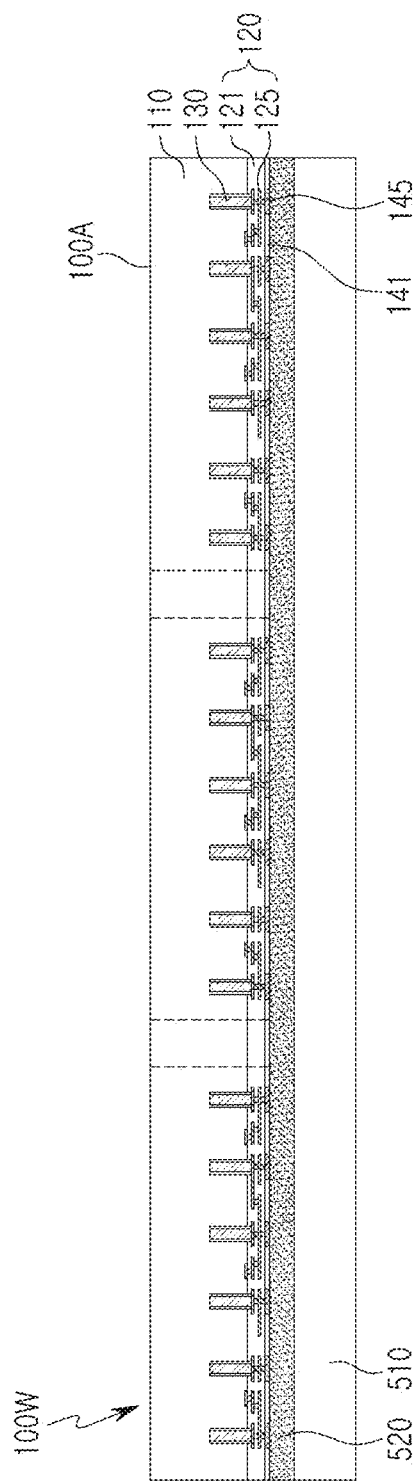
FIGS. 7A to 7D are cross-sectional diagrams illustrating main processes of a method of manufacturing a semiconductor chip according to example embodiments of the present disclosure.

Referring to FIG. 7A, a semiconductor wafer 100W for a plurality of semiconductor chips 100A may be temporarily bonded to be supported by a carrier substrate 510 using a bonding material layer 520.

In this process, the semiconductor wafer 100W may be bonded such that the active surface side of the semiconductor wafer 100W may oppose the carrier substrate, and the semiconductor wafer 100W may be stably supported by the adhesive material layer 520 such as glue during a subsequent process. The semiconductor wafer 100W may include components for the first semiconductor chip 100A. For example, the through electrode 130 may be formed on the active surface of the semiconductor wafer together with the device region, the wiring structure 120, and the lower bonding pad 145. As for the through electrode 130, the semiconductor wafer 100W may be formed in advance before or while forming the device region, and the through electrode 130 may have a depth greater than the thickness of a final semiconductor chip from the active surface (the through electrode 130 may not entirely penetrate the wafer).

Figure 7B:
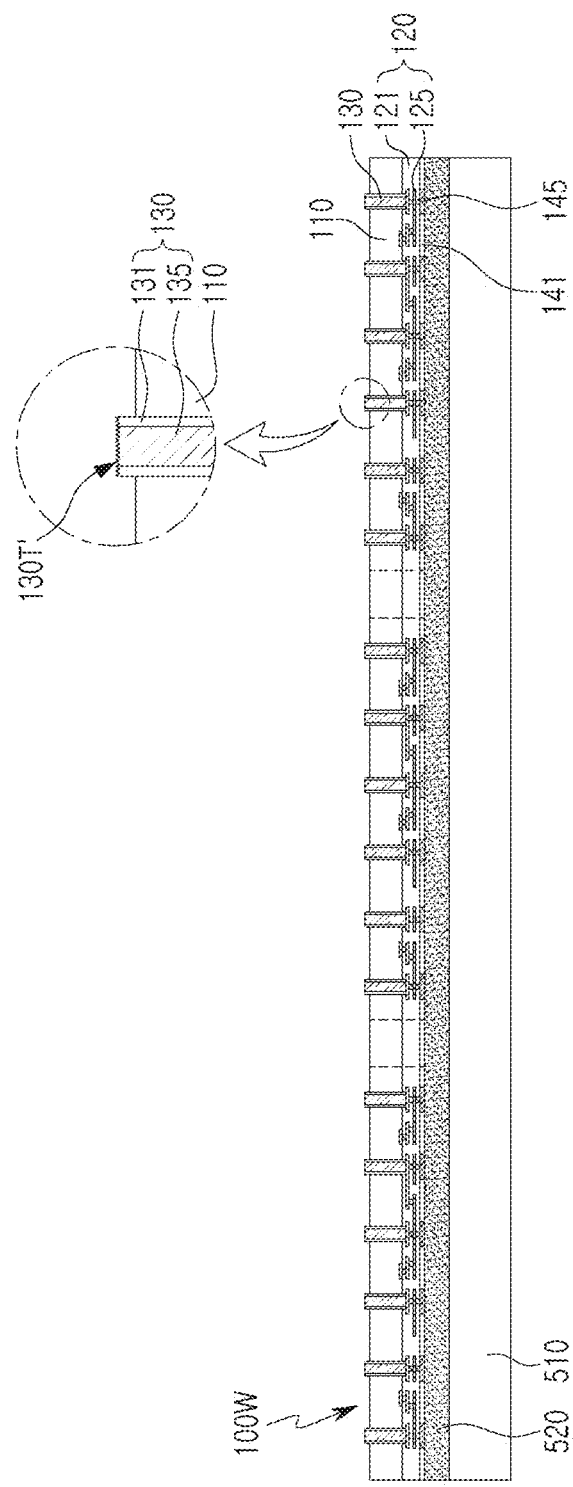

Referring to FIG. 7B, the thickness of the semiconductor wafer 100W may be reduced by applying a polishing process to the upper surface (inactive surface) of the semiconductor wafer 100W.

In this process, by removing a portion of the semiconductor wafer 100W, the upper end 130T' of the through electrode 130 may protrude from the upper surface of the semiconductor wafer 100W. Through this polishing process, the thickness of the semiconductor wafer 100W may be reduced to a desired thickness of the first semiconductor chip 100A. For this process, a grinding process such as a chemical mechanical polishing (CMP) process, an etch-back process, or a combination thereof may be used. For example, in this process, the thickness of the semiconductor wafer 100W may be reduced to a predetermined or alternatively, desired thickness by performing a grinding process, and the through electrode 130 may be sufficiently exposed by applying the etch-back under appropriate conditions.

Figure 7C:
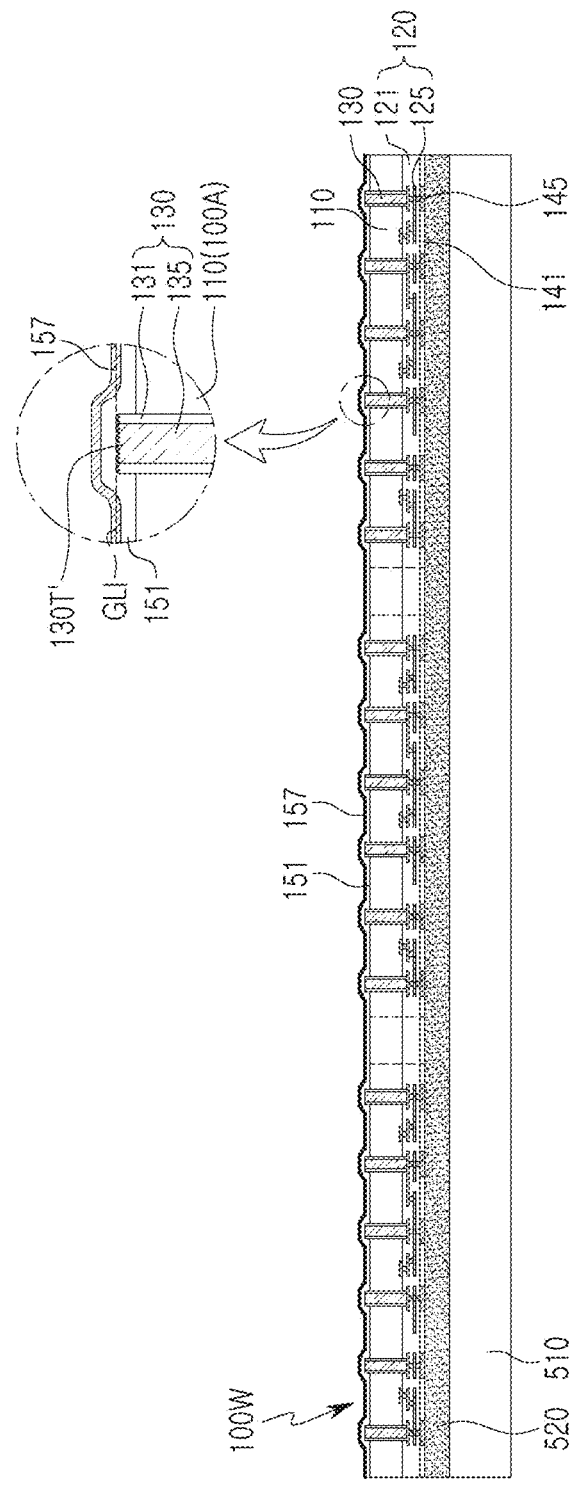

Thereafter, referring to FIG. 7C, a protective insulating film 151 and a buffer film 157 may be formed in order on the upper surface of the semiconductor wafer 100W to cover the exposed upper end 130T of the through electrode 130. Thereafter, referring to FIG. 7D, the protective insulating film 151 and the buffer film 157 may be ground to expose the through electrode 130.

The protective insulating film 151 may be silicon oxide, and the buffer film 157 may be silicon nitride or silicon oxynitride. A grinding process may be performed up to a predetermined or alternatively, desired line GL1 such that the insulating layer protective film 151 and the buffer film 157 may be partially removed and the through electrode 130 may be exposed. Through this grinding process, the protective insulating film 151 may have an upper surface substantially coplanar with the upper surface of the through electrode 130. Also, a damaged portion of the upper end 130T of the through electrode 130 may be removed.

FIGS. 8A to 8F are cross-sectional diagrams illustrating main processes of a method of manufacturing a semiconductor chip (corresponding to FIG. 3) according to example embodiments.

Figure 7D:
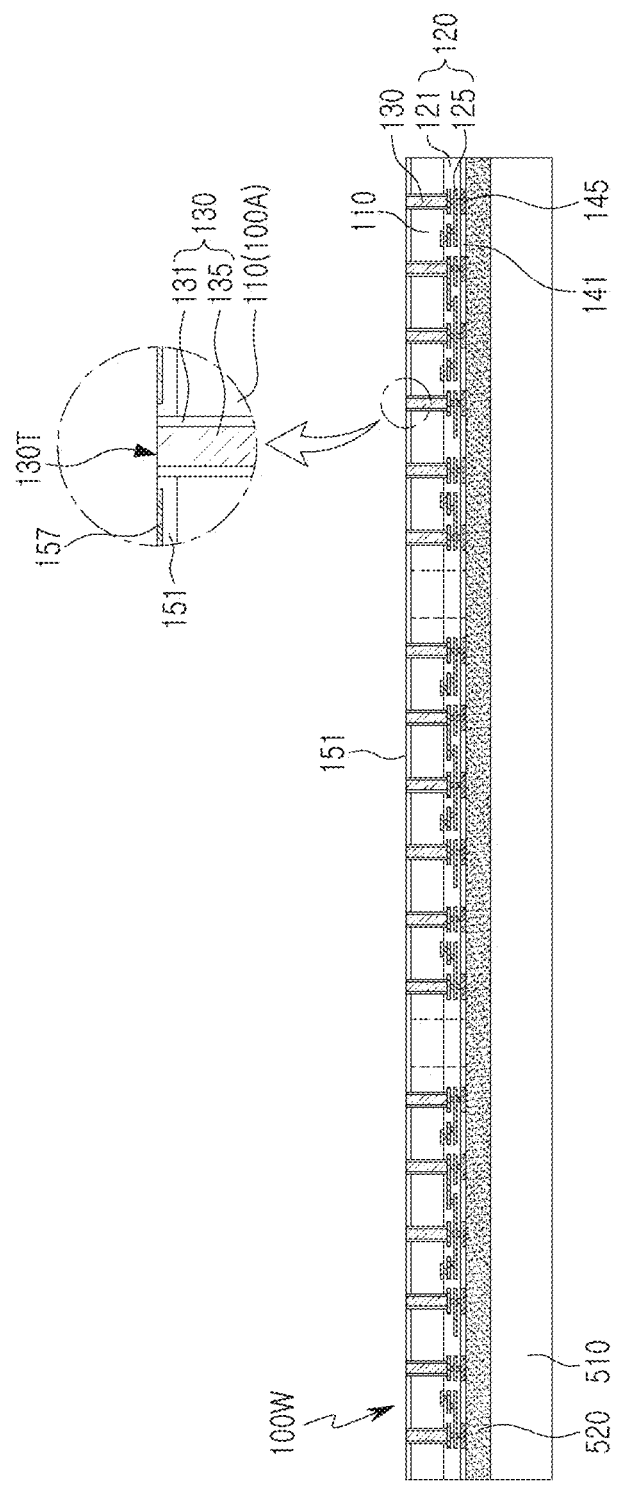
Figure 8A:
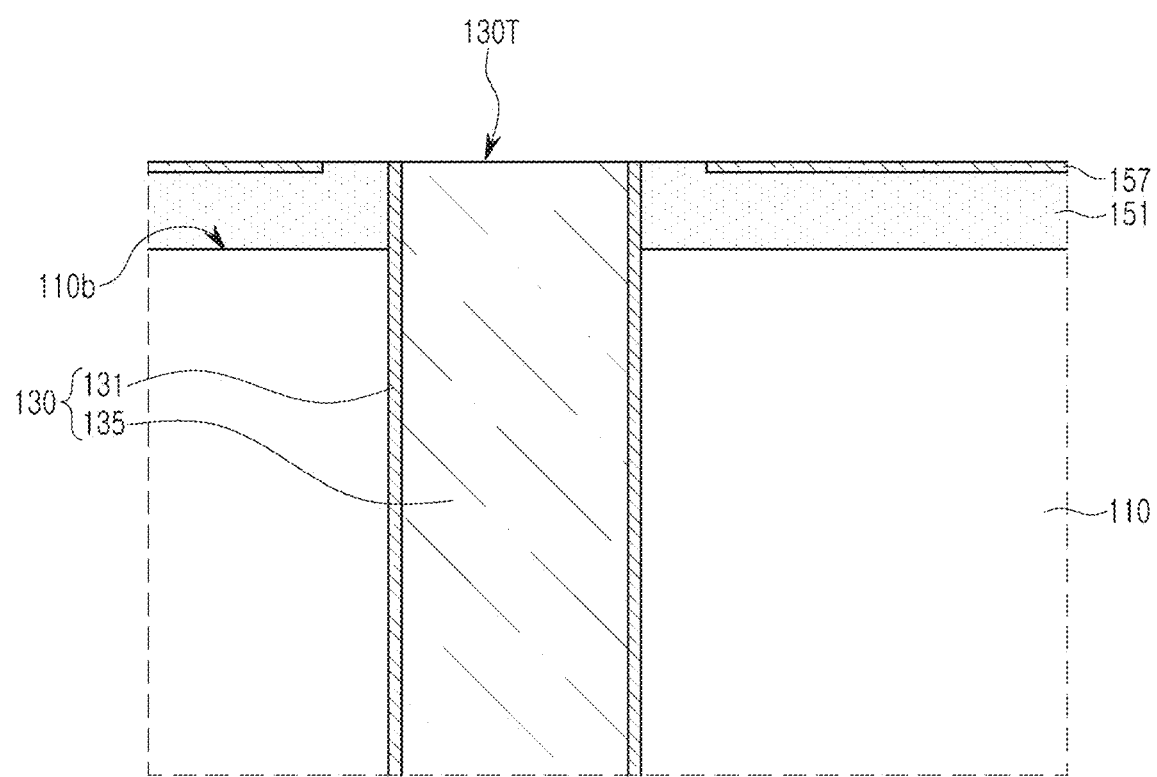
FIGS. 8A to 8F are cross-sectional diagrams illustrating main processes of a method of manufacturing a semiconductor chip (corresponding to FIG. 3) according to example embodiments of the present disclosure.

The portion illustrated in FIG. 8A may correspond to the portion illustrated in FIG. 3, and may correspond to a portion of the wafer-level first semiconductor chip 100A manufactured in FIG. 7D. Also, the subsequent processes may be wafer level processes in FIGS. 7A to 7D and may be consecutively performed.

Figure 8B:
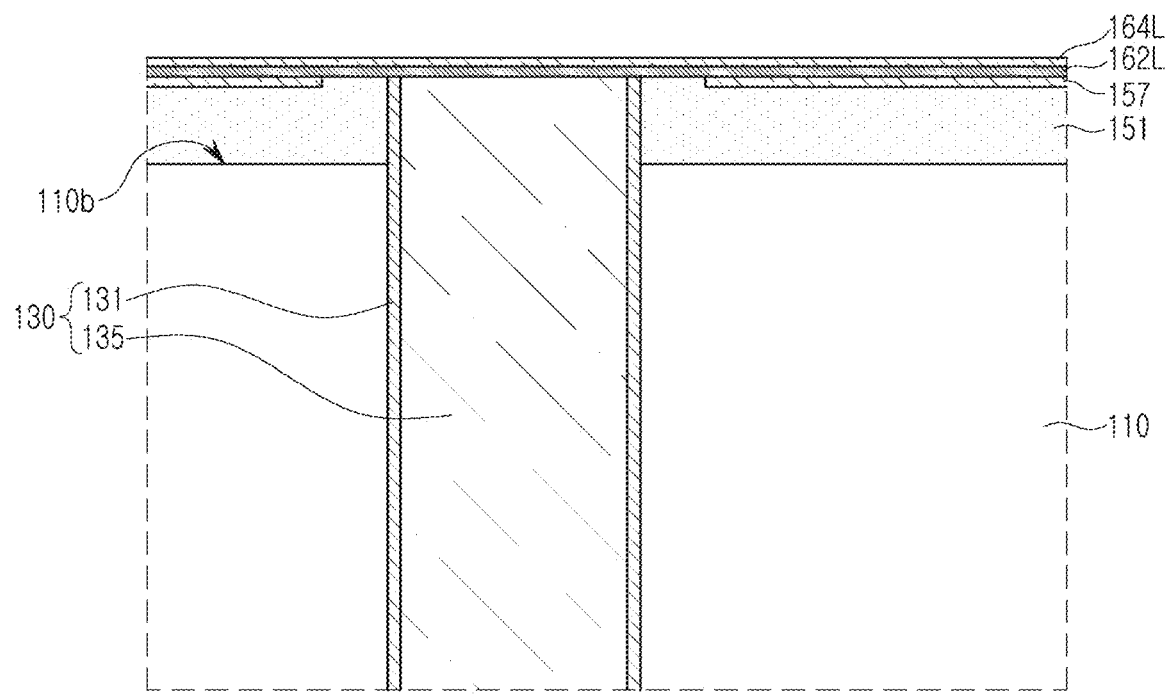

Referring to FIG. 8B, a conductive barrier layer 162 and a seed layer 164 may be sequentially formed on the protective insulating film 151.

Figure 8C:
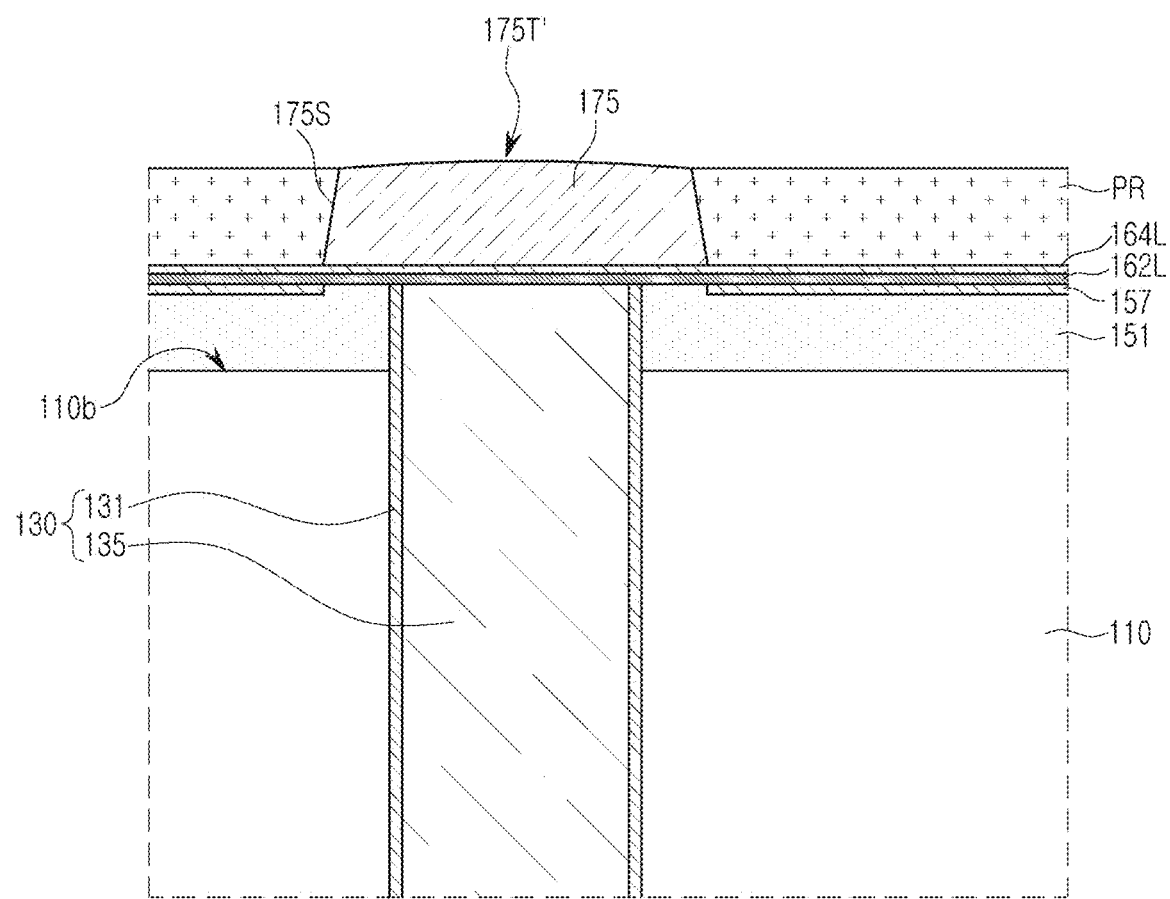

The conductive barrier 162 layer may be provided as a barrier to reduce or prevent diffusion of a metal component such as Cu before the seed layer 164 is formed, and the seed layer 164 may be used as a seed for the plating process to form the upper bonding pad 175 (in FIG. 8C). For example, the conductive barrier layer 162 may include at least one of titanium (Ti), titanium nitride (TiN), tantalum (Ta), and tantalum nitride (TaN). For example, the seed layer 164 may include copper (Cu), chromium-copper (Cr—Cu), palladium (Pd), platinum (Pt), gold (Au), or a combination thereof. In example embodiments, the seed layer 164 may include Cu.

Thereafter, referring to FIG. 8C, a photoresist pattern PR having an opening may be formed on the semiconductor wafer 100W, and the upper bonding pad 175 may be formed in the opening.

In example embodiments, the opening may be provided to define a formation region of the bonding pad, and a desired opening may be formed through an exposure/development process after the photoresist layer is formed. The opening may have a space of which a width decreases upwardly. The upper bonding pad 175 may be formed on the region of the seed layer 164 exposed through the opening using an electroplating process. The side surface 175S of the upper bonding pad 175 may have a surface inclined inwardly. For example, the upper bonding pad 175 may include Cu. The upper bonding pad 175 formed in this process may have a non-flat upper surface 175T (a slightly convex upper surface), and may have a flat surface in a subsequent grinding process.

Figure 8D:
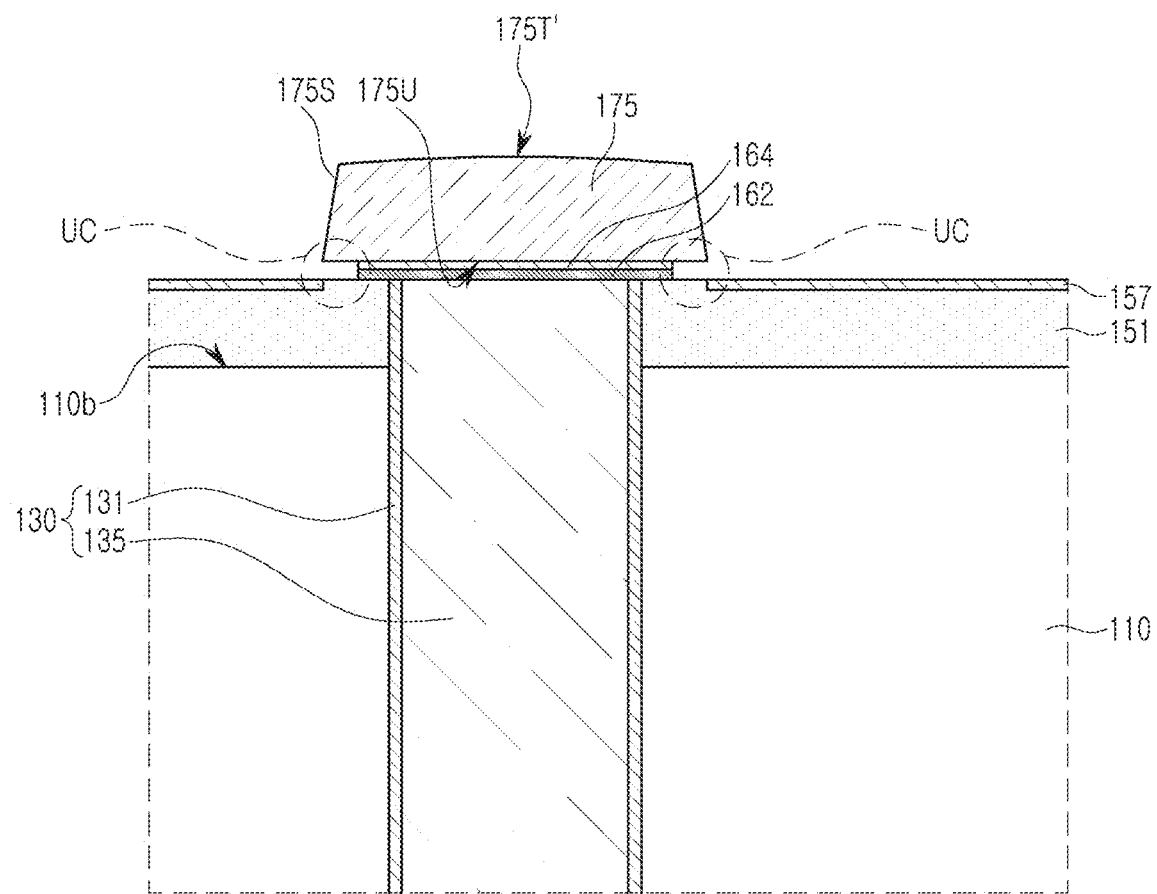

Thereafter, referring to FIG. 8D, the photoresist pattern PR may be removed, and exposed portions of the conductive barrier layer 162 and the seed layer 164 may be removed.

The photoresist pattern PR may be removed using an ashing process. After the photoresist pattern PR is removed, the exposed portions of the conductive barrier layer 162 and the seed layer 164 may be etched. In this etching process, a region disposed below the upper bonding pad 175 may be partially etched. Accordingly, the remaining portions of the conductive barrier layer 162 and the seed layer 164 may have an undercut structure UC, inwardly spaced apart from the outer periphery of the upper bonding pad 175. A distance by which the conductive barrier layer 162 and the seed layer 165 are spaced apart from the outer periphery of the upper bonding pad 175 may be in the range of 1% to 15% of the width (with respect to the width of the lower end) of the upper bonding pad 175, and may be may in the range of 2% to 10% of the width in example embodiments.

Figure 8E:
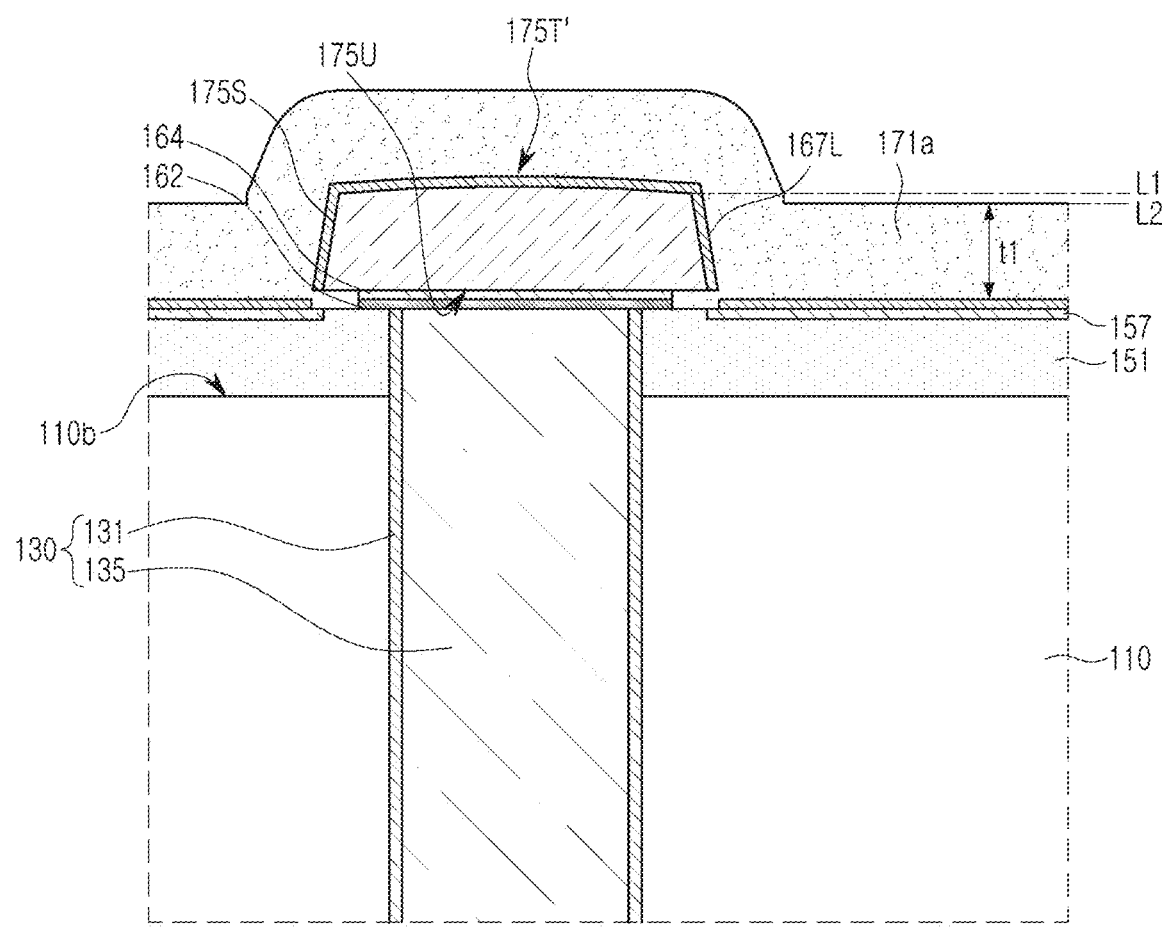

Thereafter, referring to FIG. 8E, a capping barrier film 167L may be formed, and a first insulating film 171a may be formed to cover the upper bonding pad 175.

The capping barrier film 167L may be used as a barrier between the upper bonding pad 175 and the first insulating film 171a. As illustrated, the capping barrier film 167L may be formed on the upper surface 175T' and the side surface 175S of the upper bonding pad 175 and may almost continuously formed on the protective insulating film 151. In example embodiments, the level L2 of the upper surface of the first insulating film 171a may be relatively lower than the level L1 (the lowest level) of the upper surface of the upper bonding pad 175. The level of the polishing stop film 179 to be formed in a subsequent process may be determined by the thickness t1 of the first insulating film 171a.

Figure 8F:
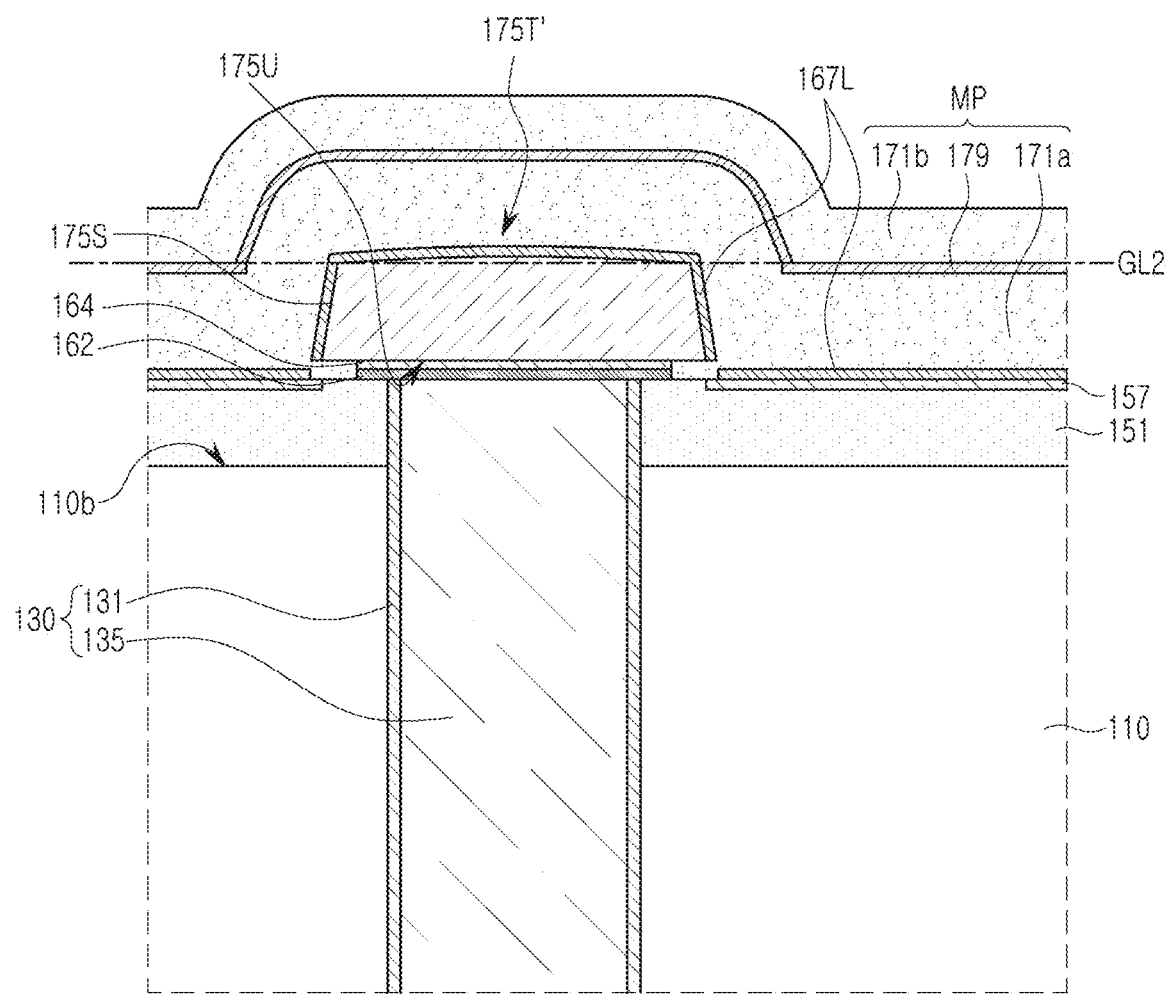

Thereafter, referring to FIG. 8F, a polishing stop film 179 and a second insulating film 171b may be formed in order on the first insulating film 171a.

The polishing stop film 175 and the second insulating film 171b may be included in a multilayer passivation MP together with the first insulating film 171a. In a subsequent process, the multilayer passivation MP may be polished using the polishing stop layer 179 such that the upper surface 175T of the upper bonding pad 175 may be exposed. In example embodiments, the polishing may be performed up to line "GL2," such that a capping barrier film portion of the upper surface 175T of the upper bonding pad 175 may be removed and the upper surface thereof may be planarized. Also, the upper surface of the upper bonding pad 175 may be substantially coplanar with the upper surface of the remaining multilayer passivation MP.

By appropriately adjusting the upper surface level L2 of the first insulating film in the previous process, the upper surface of the multilayer passivation MP may be provided by the polishing stop film 179 in example embodiments. In example embodiments, the remaining polishing film 179 may also be referred to as an "insulating interfacial layer" as described above. The remaining polishing stop film 179 may be embedded in the upper insulating layer 171 and may provide a bonding surface, and may be spaced apart from the upper bonding pad 175. In example embodiments, the distance d2 by which the remaining polishing stop layer 179 is spaced apart from the upper bonding pad 175 may be in a range of 60% to 100% of the thickness of the upper bonding pad 175.

Figure 9A:
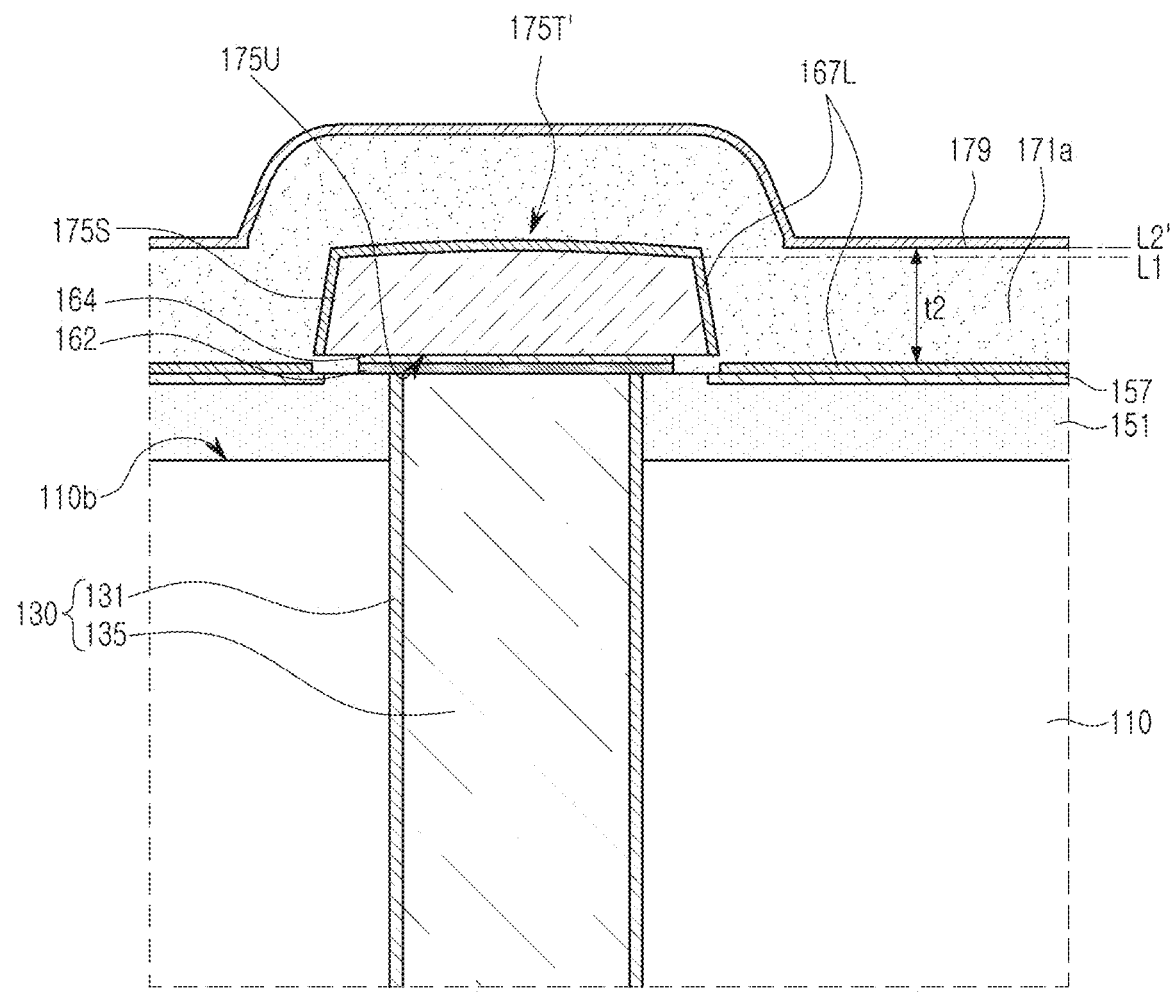
FIGS. 9A and 9B are cross-sectional diagrams illustrating main processes of a method of manufacturing a semiconductor chip (corresponding to FIG. 5) according to example embodiments of the present disclosure.
Figure 9B:
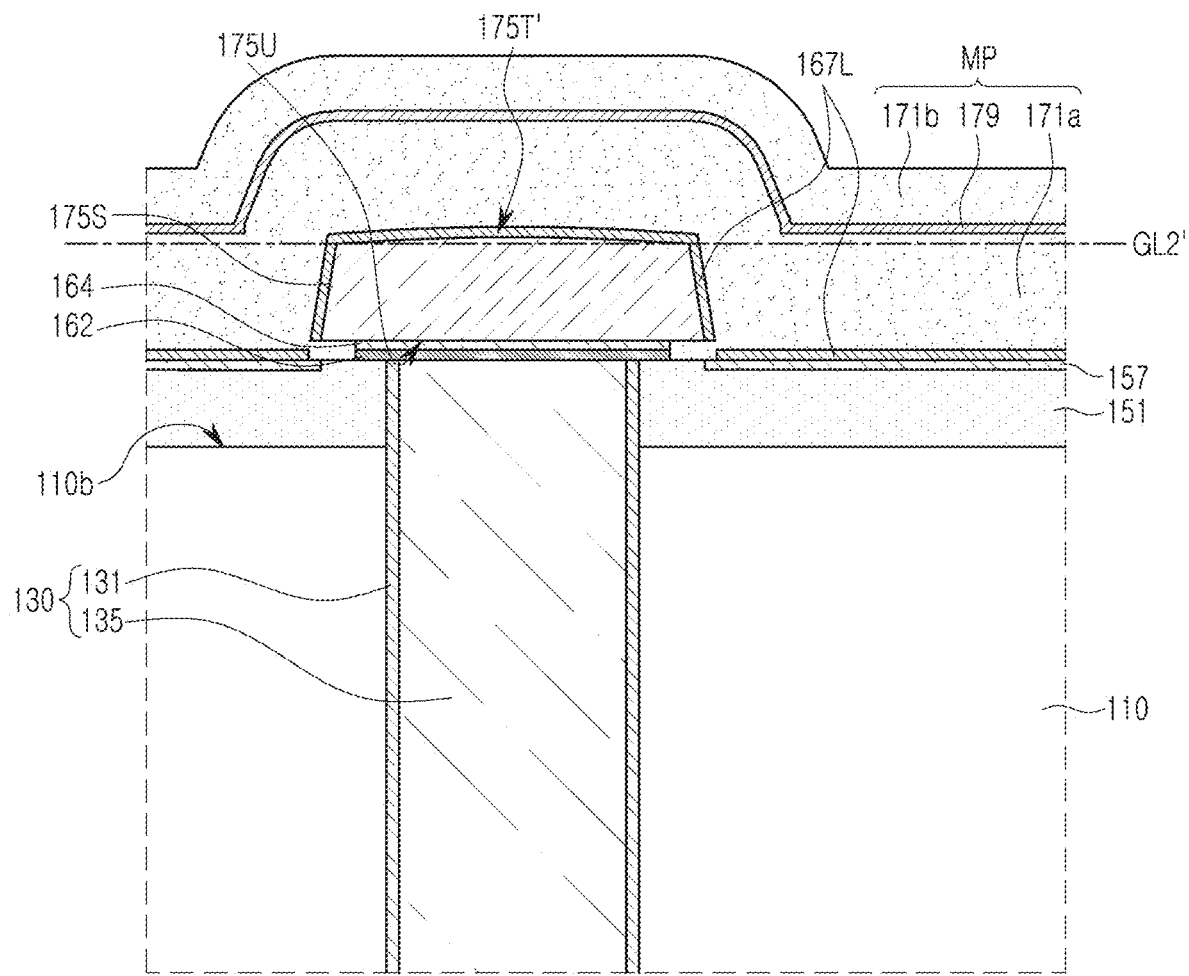

FIGS. 9A and 9B are cross-sectional diagrams illustrating main processes of a method of manufacturing a semiconductor chip (corresponding to FIG. 5) according to example embodiments. The process illustrated in FIG. 9A according to example embodiments may be understood as a subsequent process of the process in FIG. 8D.

Referring to FIG. 9A, a capping barrier film 167L may be formed on the surface of the upper bonding pad 175, and a first insulating film 171a and a polishing stop film 179 may be formed to cover the upper bonding pad 175.

In example embodiments, the first insulating film 171a may have a thickness t2 relatively larger than the thickness t1 of the first insulating film described in the aforementioned example embodiments. That is, the level L2' of the upper surface of the first insulating film 171a may be relatively higher than the level L1 (the lowest level) of the upper surface of the upper bonding pad 175. Accordingly, the polishing stop film 175 may be disposed on a level relatively higher than the level L1 of the upper surface of the upper bonding pad 175 (see the first semiconductor chip 100A in FIG. 3).

Thereafter, referring to FIG. 9B, a second insulating film 171b may be formed on the polishing stop film 179, and a multilayer passivation (MP) may be polished up to line "GL2'" using the polishing stop film 179.

Through this polishing process, the upper surface 175T of the upper bonding pad 175 may be planarized, and simultaneously, the upper surface of the upper bonding pad 175 may be substantially coplanar with the upper surface of the remaining multilayer passivation MP. Also, the polishing stop film 179 may be entirely removed, such that, differently from the previous embodiments, the upper insulating layer 171 may be provided as a bonding surface (see the first semiconductor chip 100A' in FIG. 5).

Figure 10A:
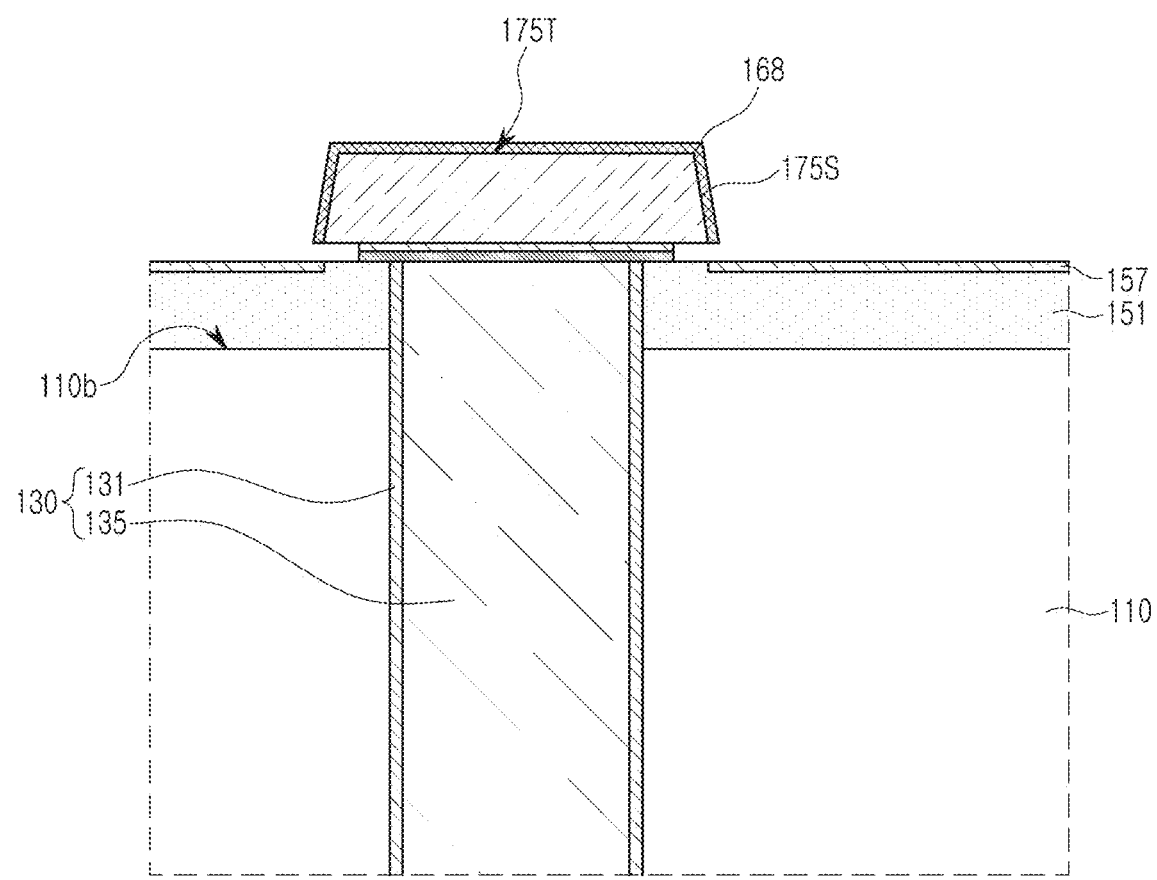
FIGS. 10A and 10B are cross-sectional diagrams illustrating main processes of a method of manufacturing a semiconductor chip (corresponding to FIG. 6) according to example embodiments of the present disclosure.
Figure 10B:
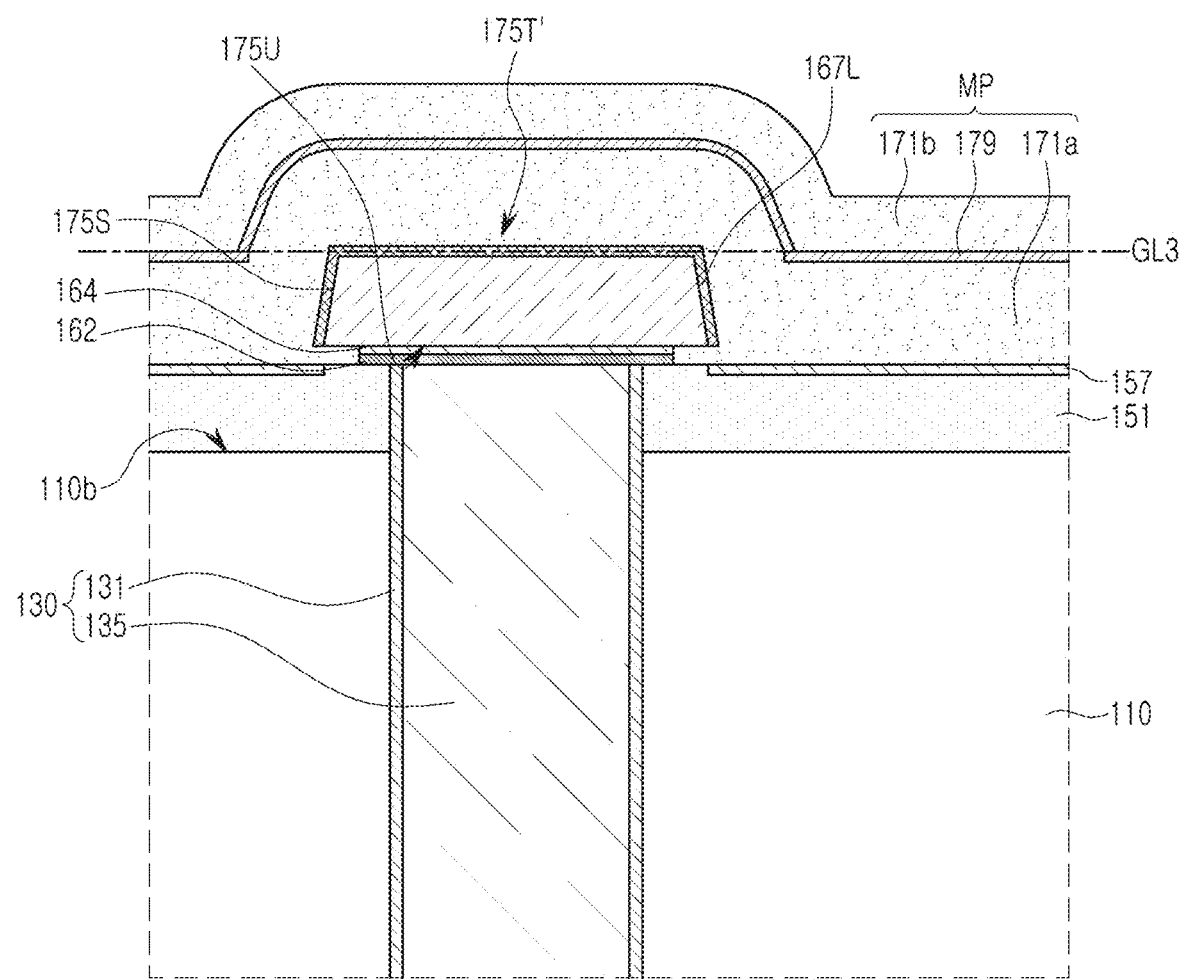

FIGS. 10A and 10B are cross-sectional diagrams illustrating main processes of a method of manufacturing a semiconductor chip (corresponding to FIG. 6) according to example embodiments. The process illustrated in FIG. 10A according to example embodiments may be understood as a subsequent process of the process in FIG. 8D.

Referring to FIG. 10A, a capping barrier film 168 may be formed on the surface of the upper bonding pad 175.

The capping barrier film 168 in example embodiments may be a conductive material. The capping barrier film 168 may be formed only on the upper surface 175T and the side surface 175S of the upper bonding pad 175, and may not be formed on the protective insulating film 151. The capping barrier film 168 may be formed by a selectively film forming process, such as, for example, an electrolytic plating process. For example, the capping barrier film 168 may include at least one of copper silicide ($CuSi_x$), titanium silicide ($TiSi_x$), CuSiN, cobalt (Co), tungsten (W), palladium (Pd), gold (Au), and nickel (Ni).

Thereafter, referring to FIG. 10B, a first insulating film 171a may be formed to cover the upper bonding pad 175, a polishing stop film 179 and a second insulating film 171b may be formed in order on the first insulating film 171a, and the multilayer passivation MP may be polished up to the "GL3'" line using the polishing stop film 179.

After the polishing process, the capping barrier film 168 may also remain on the upper surface of the upper bonding pad 175. Since the capping barrier film 168 in example embodiments is a conductive material, the capping barrier film 168 may not interfere with electrical connection. The capping barrier film 168 formed in this process may be formed on almost the entire upper surface of the upper bonding pad 175, and a portion disposed on the upper surface may have a thickness less than a thickness of a portion disposed on the side surface (see the first semiconductor chip 100A" in FIG. 6). In other example embodiments, the capping barrier film 168 may remain only on a partial region of the upper surface of the upper bonding pad 175.

Figure 11:
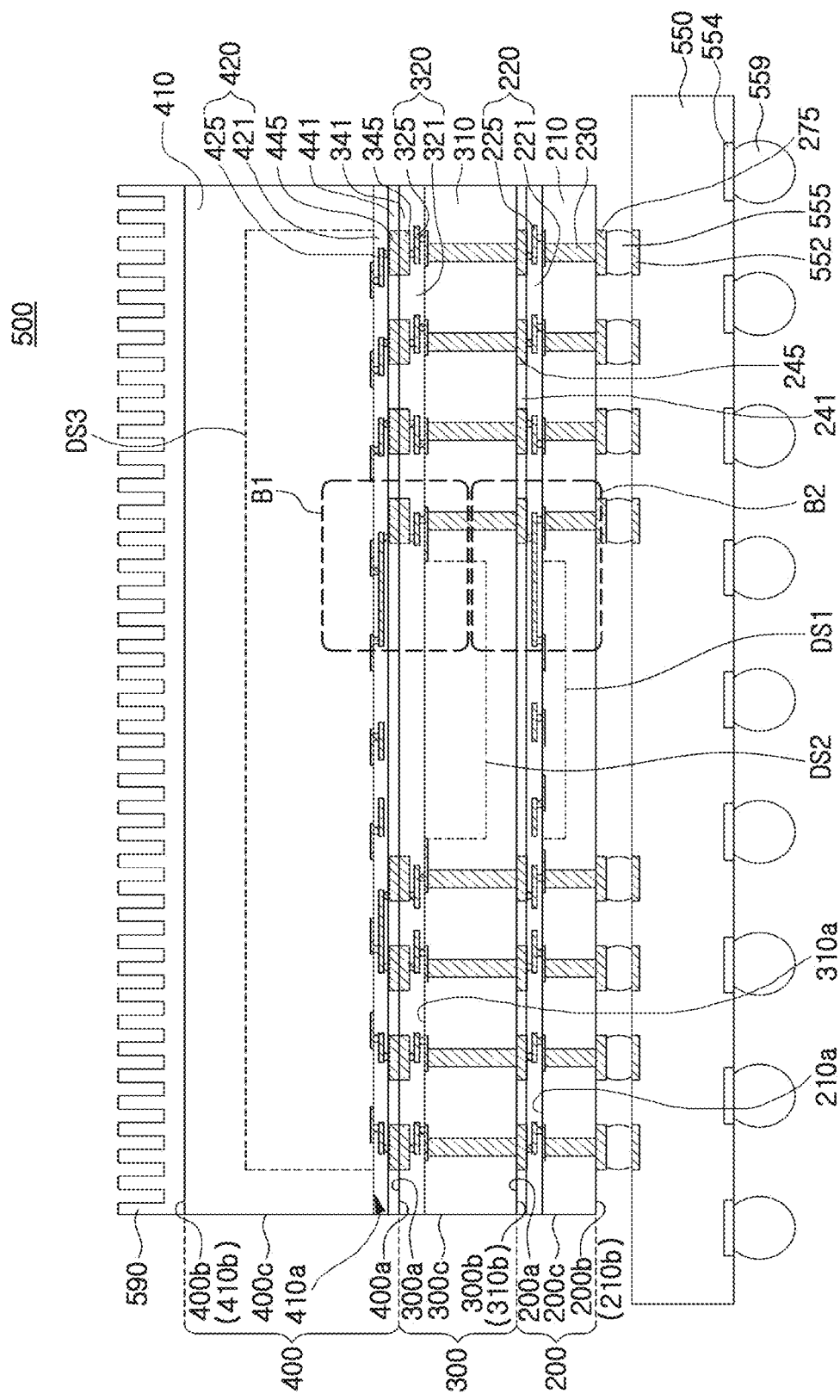
FIG. 11 is a cross-sectional diagram illustrating a semiconductor package according to example embodiments of the present disclosure, viewed from the side.
Figure 12A:
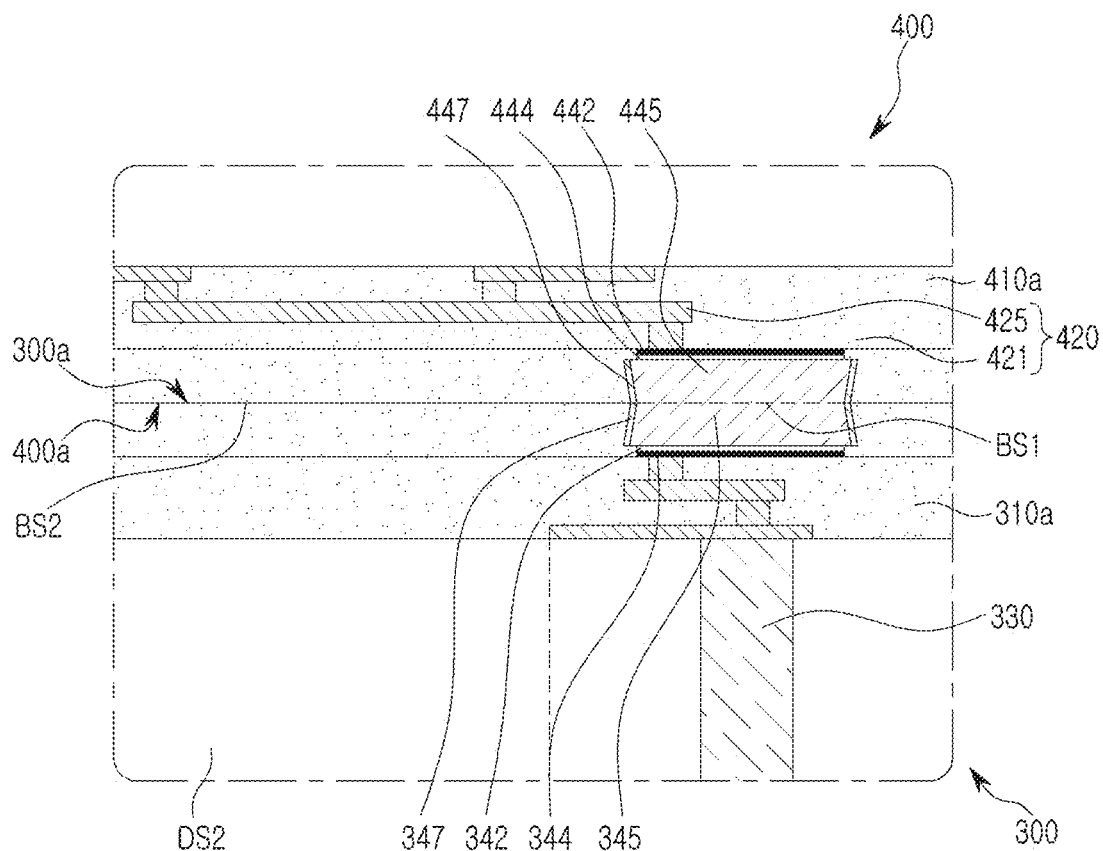
FIGS. 12A and 12B are enlarged diagrams illustrating portions "B1" and "B2" of the semiconductor package illustrated in FIG. 11, respectively.
Figure 12B:
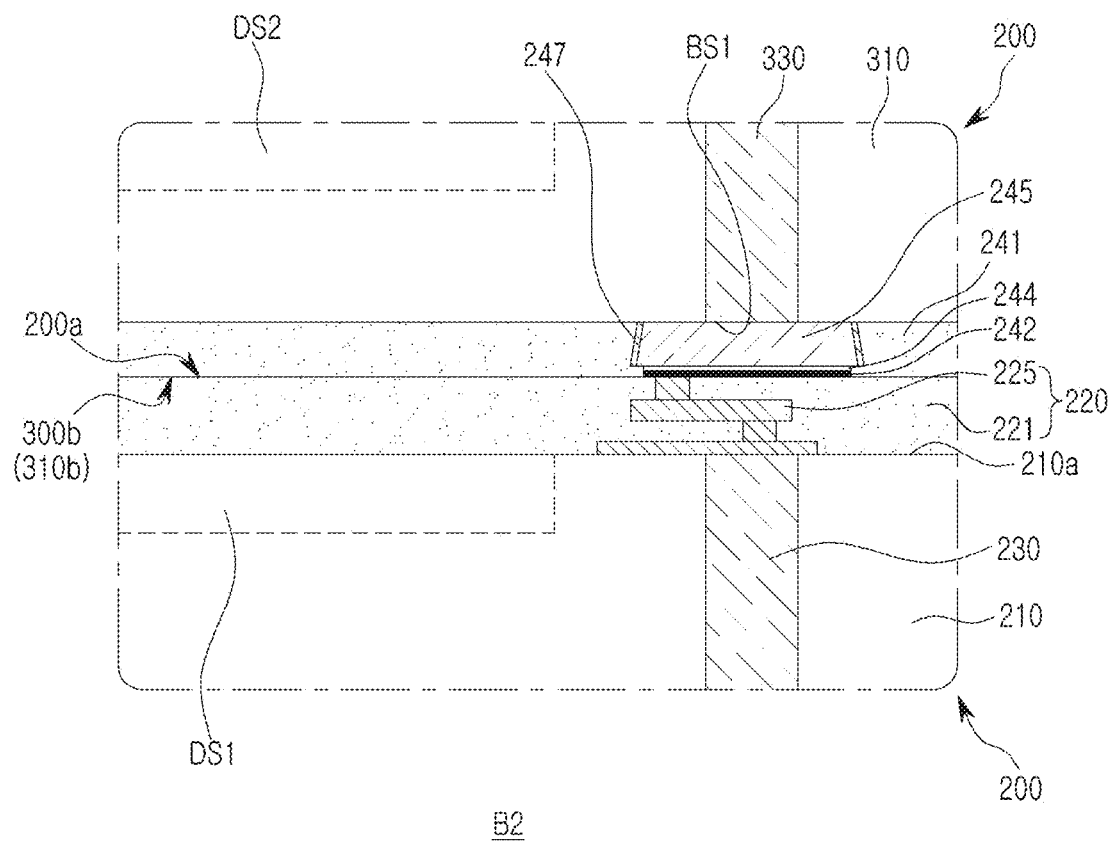

FIG. 11 is a cross-sectional diagram illustrating a semiconductor package according to example embodiments. FIGS. 12A and 12B are enlarged diagrams illustrating portions "B1" and "B2" of the semiconductor package illustrated in FIG. 11, respectively.

Referring to FIGS. 12A and 12B together with FIG. 11, a semiconductor package 500 according to example embodiments may include first to third semiconductor chips 200, 300, and 400 stacked on a package substrate 550. The package substrate 550 may include an upper pad 552, a lower pad 554 and an internal wiring (not illustrated) connecting the upper pad 552 to the lower pad 554. For example, the package substrate 550 may include a printed circuit board or a silicon interposer substrate. Also, the semiconductor package 500 may further include conductive bumps 555 connected to the first semiconductor chip 200 and external connection terminals 559 connected to an external device.

Differently from example embodiments illustrated in FIG. 1, the first to third semiconductor chips 200, 300, and 400 in example embodiments may be configured as chips for performing other functions.

The first semiconductor chip 200 may have a front surface 200a and a rear surface 200b. The first semiconductor chip 200 may include a substrate 210 such as silicon (Si) having an active surface 210a and an inactive surface 210b disposed opposite to the active surface 210a. The first semiconductor chip 200 may include a first integrated circuit DS1 formed on the active surface 210a of the substrate. The first integrated circuit DS1 may include an electronic device such as a transistor. In example embodiments, the first integrated circuit DS1 may form a memory device. For example, the first semiconductor chip 200 may be a memory chip such as a DRAM, an SRAM, an MRAM, or a flash memory.

The first semiconductor chip 200 may include a first wiring structure 220 disposed on the active surface 210a side of the first substrate 210. The first wiring structure 220 may include a first dielectric layer 221 and a first wiring layer 225. A first insulating layer 241 and first bonding pads 245 connected to the first wiring layer 225 may be included on the first wiring structure 220. For example, the first bonding pads 245 may be disposed in the first insulating layer 241, and the upper surface of the first insulating layer 241 and the upper surface of the first bonding pads 245 may provide a bonding surface 200a coplanar with the upper surfaces mentioned above. The first wiring layer 225 may be connected to the first integrated circuit DS1 of the first semiconductor chip 200, and may be connected to the first bonding pads 245. The first wiring layer 225 and the first bonding pads 245 may include a conductive material such as metal. The first insulating layer 241 may include an insulating material such as silicon oxide (SiO).

The first semiconductor chip 200 may include first through electrodes 230. The first through electrodes 230 may vertically penetrate the first semiconductor chip 200. The first through electrodes 230 may be connected to the first wiring layer 225. The first through electrodes 230 may extend toward the rear surface 200b of the first semiconductor chip 200 and may be exposed to the rear surface 200b of the first semiconductor chip 200. The first rear pads 275 may be provided on the rear surface 200b of the first semiconductor chip 200 and may be connected to the first through electrodes 230.

The first semiconductor chip 200 may be mounted on the package substrate 550. As illustrated in FIG. 11, the first semiconductor chip 200 may be disposed to be faced-up on the package substrate 550. For example, the first semiconductor chip 200 may be disposed such that the rear surface 200b may face the package substrate 550, and the first semiconductor chip 200 may be electrically connected to the package substrate 550. The first semiconductor chip 200 may be mounted on the substrate package 550 by a flip chip method. For example, connection terminals 555 may be provided between the first rear pads 240 provided on the rear surface 200b of the first semiconductor chip 200 and the upper pads 552 of the package substrate 550.

The second semiconductor chip 300 may be disposed on the first semiconductor chip 200. The second semiconductor chip 300 may include a substrate 310 such as silicon (Si) having an active surface 310a and an inactive surface 310b opposite to the active surface. The second semiconductor chip 300 may include a passive element (not illustrated), but example embodiments thereof are not limited thereto. For example, the passive element may be a capacitor device, a resistor device, or an inductor device. The second semiconductor chip 300 may have a front surface 300a and a rear surface 300b. For example, the second semiconductor chip 300 may include a second wiring structure 320 disposed on the active surface 310a side of the substrate 310. The second wiring structure 320 may include a second dielectric layer 321 and a second wiring layer 325. A first insulating layer 341 and second bonding pads 345 connected to the second wiring layer 325 may be included on the second wiring structure 320. For example, the second bonding pads 345 may be disposed in the first insulating layer 341, and the upper surface of the first insulating layer 341 and the upper surface of the second bonding pads 345 may provide a bonding surface 300a coplanar with the upper surfaces mentioned above. The second wiring layer 325 may be connected to the second integrated circuit DS2 of the second semiconductor chip 300, and may be connected to the second bonding pads 345. The second wiring layer 325 and the second bonding pads 345 may include a conductive material such as metal. The second insulating layer 341 may include an insulating material such as silicon oxide (SiO). The second semiconductor chip 300 may include second through electrodes 330. The second through electrodes 330 may vertically penetrate the second semiconductor chip 300. The second through electrodes 330 may be connected to the second wiring layer 325. The second through electrodes 330 may extend toward the rear surface 300b of the second semiconductor chip 300 and may be exposed to the rear surface 300b of the second semiconductor chip 300.

The second semiconductor chip 300 may be mounted on the first semiconductor chip 200. As illustrated in FIG. 11, the second semiconductor chip 300 may be disposed to be faced-up on the first semiconductor chip 200. For example, the second semiconductor chip 300 may be disposed such that the rear surface 300b of the second semiconductor chip 300 may face the first semiconductor chip 200. In some example embodiments, the rear surface 300b of the second semiconductor chip 300 may be in contact with the front surface 200a of the first semiconductor chip 200. For example, the rear surface 300b of the second semiconductor chip 300 may be in contact with the first insulating layer 241 and the front surface 200a provided by the first bonding pads.

As illustrated in FIG. 12B, the second semiconductor chip 300 may be bonded to the first semiconductor chip 200. For example, the first bonding pads 245 of the first semiconductor chip 200 may be bonded to the second through electrodes 330 of the second semiconductor chip 300 on the boundary between the first semiconductor chip 200 and the second semiconductor chip 300.

Similarly to the bonding structures in the aforementioned example embodiments, each of the first bonding pads 245 may have a side inclined toward the front surface 300a, and a capping barrier film 247 may be disposed on the inclined side surface. A first conductive barrier layer 242 and a first seed layer 244 may be disposed between the first bonding pads 245 and the first interconnection structure 220. The first conductive barrier layer 242 and the first seed layer 244 may have an undercut structure, inwardly spaced apart from the outer periphery of each of the first bonding pads 245.

The first bonding pads 245 and the second through electrodes 330 may form an intermetallic interfacial bonding surface BS1. As such, the first bonding pads 245 may be directly bonded to the second through electrodes 330 of the second semiconductor chip 300 even without a bonding pad structure. For example, the first bonding pads 225 and the second through-electrodes 330 may be formed of the same material (e.g., copper (Cu)), such that the interfacial surface between the first bonding pads 245 and the second through electrode 330 may not be distinct. The second semiconductor chip 300 and the first semiconductor chip 200 may be electrically connected to each other through the first bonding pads 245 and the second through electrodes 330. In example embodiments, the second through electrodes 330 and the first bonding pads 245 may be bonded to each other using the intermetallic bonding having a strong bonding force, and accordingly, structural stability of the semiconductor package 500 may improve.

Referring to FIGS. 11 and 12A, the third semiconductor chip 400 may be disposed on the second semiconductor chip 300. The third semiconductor chip 400 may be a substrate 410 having a front surface 400a and a rear surface 400b, and having an active surface 410a and an inactive surface 410b disposed opposite to each other. The third semiconductor chip 400 may include a third integrated circuit DS3. The third integrated circuit DS3 may include an electronic device such as a transistor. For example, the third integrated circuit DS3 may be a logic device. That is, the third semiconductor chip 400 may be a logic chip. For example, the third semiconductor chip 400 may include a third interconnection structure 420 disposed on the active surface 410a side. The third wiring structure 420 may include a third dielectric layer 421 and a third wiring layer 425. A third insulating layer 441 may be formed on the third interconnection structure 420, and third bonding pads 445 connected to the third interconnection layer 425 may be disposed on the third insulating layer 441. Lower surfaces of the third bonding pads 445 may be coplanar with one surface of the third insulating layer 441. The third bonding pads 445 may be connected to the third integrated circuit DS3 of the third semiconductor chip 400 through the third wiring layer 425. The third wiring layer 425 and the third bonding pads 445 may include a conductive material such as metal. The third insulating layer 441 may include an insulating material such as silicon oxide (SiO).

The third semiconductor chip 400 may be mounted on the second semiconductor chip 300. As illustrated in FIG. 12A, the third semiconductor chip 400 may be disposed to be faced-down on the second semiconductor chip 300. For example, as for the third semiconductor chip 400, the front surface 400a of the third semiconductor chip 400 may face the second semiconductor chip 300. In some example embodiments, the front surface 400a of the third semiconductor chip 400 may be in contact with the front surface 300a of the second semiconductor chip 300. For example, the third bonding pads 445 of the third semiconductor chip 400 and the second bonding pads 345 of the second semiconductor chip 300 may be in contact with each other.

Similarly to the bonding structure in the aforementioned example embodiments, the second bonding pads 345 and the third bonding pads 445 may have side surfaces inclined toward the front surfaces 300a and 400a, respectively, and capping barrier films 347 and 447 may be disposed on the inclined side surfaces, respectively. A second conductive barrier layer 344 and a second seed layer 342 may be disposed between the second bonding pads 345 and the second interconnection structure 320. The second conductive barrier layer 344 and the second seed layer 342 may have an undercut structure, inwardly spaced apart from the outer periphery of each of the second bonding pads 345.

Similarly, in the third semiconductor chip 400, a third conductive barrier layer 442 and a third seed layer 442 disposed below the third bonding pads may also be disposed, and the third conductive barrier layer 442 and the third seed layer 442 may have an undercut structure, inwardly spaced apart from the outer periphery of each of the third bonding pads 445.

The second bonding pads 345 and the third bonding pads 445 may form an intermetallic interfacial bonding surface BS1. For example, the second bonding pads 345 and the third bonding pads 4450 may be formed of the same material (e.g., copper (Cu)), such that an interfacial surface between the second bonding pads 345 and the third bonding pad 4450 may not be distinct. As such, the second bonding pads 345 and the third bonding pads 445 may be bonded to each other using intermetallic bonding having strong bonding force, and accordingly, structural stability of the semiconductor package 500 may improve.

Also, the second insulating layer 341 of the second semiconductor chip 300 may be in contact with the insulating layer 441 on the boundary between the second semiconductor chip 300 and the third semiconductor chip 400. In some example embodiments, the second insulating layer 341 and the third insulating layer 441 may form inter-dielectric hybrid bonding. For example, the second insulating layer 341 and the third insulating layer 441 may be continuously formed, and the bonding surface B2 between the second insulating layer 341 and the third insulating layer 441 may not be visually distinct. For example, the second insulating layer 341 and the third insulating layer 441 may be formed of the same material (e.g., silicon oxide ($SiO_2$)), such that the interfacial surface between the second insulating layer 341 and the third insulating layer 441 may not be distinct.

As described above, the semiconductor package 500 according to example embodiments may have a structure in which different types of the first semiconductor chip 200, the second semiconductor chip 300, and the third semiconductor chip 400 are stacked. Also, the stacking process may be implemented by a wafer-on-wafer (WOW) method and also a wafer-on-die method.

In example embodiments, since the third semiconductor chip 400, which may be a logic chip, may generate a large amount of heat when being driven, the third semiconductor chip 400 may be disposed on an uppermost end. Also, a heat radiator 590 may be disposed on the rear surface 400b of the third semiconductor chip 400. For example, the heat radiator 590 may be attached to the third semiconductor chip 400 using an adhesive film (not illustrated). For example, the adhesive film (not illustrated) may include a thermal interfacial surface material (TIM) such as thermal grease. The heat sink 550 may radiate heat generated from the stack structure to the outside.

According to the aforementioned example embodiments, by forming the bonding pad in advance using a photoresist pattern and polishing the passivation layer using a polishing stop film, a flat bonding surface may be formed, and a stack of the semiconductor chips having an interfacial bonding surface having improved quality may be implemented.

While example embodiments have been illustrated and described above, it will be apparent to those skilled in the art that modifications and variations could be made without departing from the scope of the present disclosure as defined by the appended claims.

What is claimed is:

1. A semiconductor package, comprising:
a first semiconductor chip having a first substrate, a first insulating layer on the first substrate, and a plurality of first bonding pads on the first insulating layer, and having a flat upper surface by an upper surface of the first insulating layer and upper surfaces of the plurality of first bonding pads; and
a second semiconductor chip on the upper surface of the first semiconductor chip and having a second substrate, a second insulating layer below the second substrate and in contact with the first insulating layer, and a plurality of second bonding pads on the second insulating layer and in contact with the first bonding pads, respectively,
wherein the first insulating layer includes an insulating interfacial layer in contact with the second insulating layer, embedded in the first insulating layer, and spaced apart from the plurality of first bonding pads.

2. The semiconductor package of claim 1, wherein a distance by which the insulating interfacial layer is spaced apart from the plurality of first bonding pads is in a range of 60% to 100% of a thickness of each of the plurality of first bonding pads.

3. The semiconductor package of claim 1, wherein the insulating interfacial layer includes at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC).

4. The semiconductor package of claim 3, wherein at least one of the first insulating layer and the second insulating layer includes silicon oxide.

5. The semiconductor package of claim 1, wherein the first semiconductor chip further includes:
a protective insulating film between the first substrate and the first insulating layer;
through electrodes penetrating the first substrate and the first insulating layer and connected to the plurality of first bonding pads, respectively; and
a conductive barrier layer and a seed layer on the protective insulating film to be positioned in a region between the plurality of first bonding pads and the through electrodes.

6. The semiconductor package of claim 5, wherein the conductive barrier layer and the seed layer are inwardly spaced apart from an outer periphery of each of the plurality of first bonding pads.

7. The semiconductor package of claim 6, wherein a distance by which each of the conductive barrier layer and the seed layer is spaced apart from the outer periphery of each of the plurality of first bonding pads is in a range of 1% to 15% of a width of each of the plurality of first bonding pads.

8. The semiconductor package of claim 5, wherein the conductive barrier layer includes at least one of titanium (Ti), titanium nitride (TiN), tantalum (Ta), and tantalum nitride (TaN), and the seed layer includes Cu.

9. The semiconductor package of claim 1, wherein each of the plurality of first bonding pads has an upwardly inclined side surface.

10. The semiconductor package of claim 1, wherein the first semiconductor chip further includes a capping barrier film on a side surface of each of the plurality of first bonding pads.

11. The semiconductor package of claim 10, wherein the capping barrier film includes at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC).

12. The semiconductor package of claim 10, wherein a thickness of the capping barrier film is in a range of 100 nm to 300 nm.

13. The semiconductor package of claim 10,
wherein the capping barrier film includes a conductive material, and
wherein the capping barrier film has a portion extending to an upper surface of each of the plurality of first bonding pads.

14. The semiconductor package of claim 13, wherein the capping barrier film includes at least one of copper silicide (CuSix), titanium silicide (TiSix), CuSiN, cobalt (Co), tungsten (W), palladium (Pd), gold (Au), and nickel (Ni).

15. The semiconductor package of claim 1, wherein the second insulating layer includes an additional insulating interfacial layer in contact with the first insulating layer or the interfacial insulating layer, embedded in the second insulating layer, and spaced apart from the plurality of second bonding pads.

16. A semiconductor package, comprising:
a first semiconductor chip having a first substrate, a first insulating layer on the first substrate, and a plurality of first bonding pads on the first insulating layer, and having a flat upper surface by an upper surface of the first insulating layer and upper surfaces of the plurality of first bonding pads; and
a second semiconductor chip on the upper surface of the first semiconductor chip and having a second substrate, a second insulating layer below the second substrate and in contact with the first insulating layer, and a plurality of second bonding pads on the second insulating layer and in contact with the first bonding pads, respectively,
wherein the first semiconductor chip includes a protective insulating film between the first substrate and the first insulating layer, through electrodes penetrating the first substrate and the first insulating layer and connected to the plurality of first bonding pads, respectively, and a first conductive barrier layer and a first seed layer sequentially on the protective insulating film between the plurality of first bonding pads and the through electrodes, and
wherein the first conductive barrier layer and the first seed layer are inwardly spaced apart from an outer periphery of each of the plurality of first bonding pads.

17. The semiconductor package of claim 16, wherein the first conductive barrier layer includes at least one of titanium (Ti), titanium nitride (TiN), tantalum (Ta), and tantalum nitride (TaN), and the first seed layer includes Cu.

18. The semiconductor package of claim 16, wherein a thickness of the first conductive barrier layer is in a range of 100 nm to 250 nm, and a thickness of the first seed layer is in a range of 50 nm to 150 nm.

19. The semiconductor package of claim 16,
wherein second semiconductor chip includes an interlayer insulating film between the second substrate and the plurality of second bonding pads, and a second conductive barrier layer and a second seed layer sequentially on the interlayer insulating film and below the plurality of second bonding pads, and
wherein the second conductive barrier layer and the second seed layer are inwardly spaced apart from an outer periphery of each of the plurality of second bonding pads.

20. A semiconductor chip, comprising:
a substrate having a first surface having an active region and a second surface opposite to the first surface;
an interlayer insulating film on the first surface of the substrate and having a wiring structure electrically connected to the active region;
a first passivation layer on the interlayer insulating film and having first bonding pads electrically connected to the wiring structure;
a protective insulating film on the second surface of the substrate;
through electrodes electrically connected to the wiring structure and penetrating the substrate and the protective insulating film;
a second passivation layer on the protective insulating film and having second bonding pads electrically connected to the through electrode, wherein each of the second bonding pads has a width increasing toward the second surface of the substrate; and
a conductive layer on the protective insulating film to be positioned in a region between the second bonding pads and the through electrodes, and inwardly spaced apart from an outer periphery of each of the second bonding pads.

* * * * *